(12) United States Patent
Lee et al.

(10) Patent No.: US 7,052,968 B1
(45) Date of Patent: May 30, 2006

(54) METHOD AND SYSTEM FOR ALIGNING IC DIE TO PACKAGE SUBSTRATE

(75) Inventors: Swee Peng Lee, Penang (MY); Ajit Dubey, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 149 days.

(21) Appl. No.: 10/819,442

(22) Filed: Apr. 7, 2004

(51) Int. Cl.
*H01L 21/76* (2006.01)

(52) U.S. Cl. .................... 438/401; 438/975; 438/462; 257/797; 257/E23.179

(58) Field of Classification Search ............... None
See application file for complete search history.

(56) References Cited

U.S. PATENT DOCUMENTS

| | | | | |
|---|---|---|---|---|
| 5,528,372 A | * | 6/1996 | Kawashima | 356/401 |
| 5,952,247 A | * | 9/1999 | Livengood et al. | 438/734 |
| 6,548,764 B1 | * | 4/2003 | Prindiville et al. | 174/255 |
| 6,593,168 B1 | * | 7/2003 | Ehrichs et al. | 438/108 |
| 6,668,449 B1 | * | 12/2003 | Rumsey et al. | 29/840 |
| 6,811,938 B1 | * | 11/2004 | Tutt et al. | 430/22 |
| 6,938,335 B1 | * | 9/2005 | Kuribayashi et al. | 29/834 |
| 2003/0027342 A1 | * | 2/2003 | Sheridan et al. | 436/43 |

* cited by examiner

*Primary Examiner*—Luan Thai
(74) *Attorney, Agent, or Firm*—Monica H. Choi

(57) ABSTRACT

In a method and system for placing an IC (integrated circuit) die onto a package substrate, a first reference is determined after locating a first fiducial on the package substrate, and a second reference is determined after locating a second fiducial on the package substrate. The IC die is placed onto the package substrate to be aligned with respect to the first and second references of the first and second fiducials that are comprised of a plurality of markings such as a plurality of dots.

36 Claims, 15 Drawing Sheets

METHOD AND SYSTEM FOR ALIGNING IC DIE TO PACKAGE SUBSTRATE

TECHNICAL FIELD

The present invention relates generally to integrated circuit manufacture, and more particularly, to a method and system for aligning an IC (integrated circuit) die onto a package substrate using fiducials.

BACKGROUND OF THE INVENTION

Referring to FIG. 1, during manufacture of an IC (integrated circuit) package 100, an IC die 102 is mounted onto a package substrate 104. For example, the IC package 100 may be a C4 IC package available from Advanced Micro Devices, Inc. having its principal place of business at Sunnyvale, Calif. Solder bumps 106A, 106B, and 106C are mounted to pads 108A, 108B, and 108C, respectively, for coupling nodes of the integrated circuit fabricated on the IC die 102 to leads (not shown in FIG. 1) of the package substrate 104. Such leads provide external access to the nodes of the integrated circuit fabricated on the IC die 102.

FIG. 2 shows a view of an upper surface 110 of the package substrate 104 having a plurality of circular pads 108A, 108B, 108C, 108D, 108E, 108F, 108G, 108H, and 108I exposed thereon. An area 112 (outlined in dashed lines in FIG. 2) of the package substrate 104 having such a plurality of pads therein is termed a "cage" of the package substrate 104. FIG. 1 illustrates a cross-sectional view of the package substrate 104 across line I—I in FIG. 2.

FIG. 3 shows a view of a bottom surface 114 of the IC die 102 having a plurality of solder bumps 106A, 106B, 106C, 106D, 106E, 106F, 106G, 106H, and 106I formed thereon. FIG. 1 illustrates a cross-sectional view of the IC die 102 across line II—II in FIG. 3. Referring to FIGS. 1, 2, and 3, the IC die 102 is placed onto the package substrate 104 with the bottom surface 114 of the IC die 102 facing the top surface 110 of the package substrate 104.

The solder bumps 106A, 106B, 106C, 106D, 106E, 106F, 106G, 106H, and 106I of the IC die 102 are desired to be coupled to the pads 108A, 108B, 108C, 108D, 108E, 108F, 108G, 108H, and 108I, respectively, of the package substrate 104. Such solder bumps of the IC die 102 are coupled to such pads of the package substrate 104 via solder joints formed from the solder bumps in a reflow process, as known to one of ordinary skill in the art. An IC die and a package substrate typically have more numerous solder bumps and pads, respectively. However, nine solder bumps and nine pads are illustrated and described herein for the IC die 102 and package substrate 104 for simplicity and clarity of illustration.

For coupling with minimized resistance between the solder bumps of the IC die 102 and the pads of the package substrate 104, the respective center point of each of the solder bumps 106A, 106B, 106C, 106D, 106E, 106F, 106G, 106H, and 106I is desired to be aligned to the respective center point of each of the pads 108A, 108B, 108C, 108D, 108E, 108F, 108G, 108H, and 108I, respectively. Such alignment is illustrated with a dashed line 116 in FIG. 1 through the centers of the example solder bump 106B and the example corresponding pad 108B.

FIG. 4 illustrates the scenario when the IC die 102 is shifted undesirably too much to the left by a first misaligned displacement 118. Similarly, FIG. 5 illustrates the scenario when the IC die 102 is shifted undesirably too much to the right by a second misaligned displacement 120. Generally, the IC die 102 may be misaligned with respect to the package substrate 104 in any of a plurality of directions when the centers of the solder bumps of the IC die 102 are not aligned to the centers of the pads of the package substrate 104.

In any case of unacceptable misalignment, undesirably high resistances or even open circuits may result with such misaligned coupling between the solder bumps of the IC die 102 and the circular pads of the package substrate 104. In the example of FIGS. 2 and 3, each of the solder bumps 106A, 106B, 106C, 106D, 106E, 106F, 106G, 106H, and 106I of the IC die 102 and each of the circular pads 108A, 108B, 108C, 108D, 108E, 108F, 108G, 108H, and 108I of the package substrate 104 has a diameter 122 of about 100 µm (micrometers).

For proper operation of the IC package 100, each solder bump of the IC package 102 is desired to be aligned with a corresponding pad of the package substrate 104 with any misalignment being less than 10 µm (micrometers). Thus, a mechanism is desired for placing the IC die 102 onto the package substrate 104 with a desired level of alignment.

SUMMARY OF THE INVENTION

Accordingly, in a general aspect of the present invention, fiducials comprised of dots are used for determining reference points that align an IC die onto a package substrate.

In a method and system for placing an IC (integrated circuit) die onto a package substrate, a first reference is determined after locating a first fiducial on the package substrate, and a second reference is determined after locating a second fiducial on the package substrate. The IC die is placed onto the package substrate to be aligned with respect to the first and second references of the first and second fiducials.

According to another aspect of the present invention, each of the fiducials is comprised of a plurality of markings such as a plurality of dots. For example, each of the first and second fiducials is comprised of dots having a same diameter as circular pads of the package substrate.

In one example embodiment of the present invention, the first and second fiducials are disposed toward diagonally opposite corners of the package substrate. In another embodiment of the present invention, a third fiducial with a third reference is disposed toward a third corner of the package substrate, and the IC die is placed onto the package substrate to be aligned with respect to the first, second, and third references.

In another embodiment of the present invention, the first fiducial is comprised of a corner dot and two side dots, with each side dot being displaced from the corner dot with a first distance. In that case, a center of the corner dot is the first reference for the first fiducial. Similarly, the second fiducial is comprised of a corner dot and two side dots, with each side dot being displaced from the corner dot with a second distance. In that case, a center of the corner dot for the second fiducial is the second reference.

In another aspect of the present invention, the first fiducial is distinguishable from the second fiducial when the first distance of the side dots from the corner dot for the first fiducial is different from the second distance of the side dots from the corner dot for the second fiducial. Such distinguishable fiducials are used for determining proper orientation of the IC die with respect to the package substrate.

In yet another embodiment of the present invention, an X component and a Y component are determined for a distance between the first and second references. Each of the X and Y components is verified to be within a respective acceptable range. An alarm is generated when each of the X and Y components is not within the respective acceptable range to prevent attachment of the IC die onto the package substrate with unacceptable misalignment.

On the other hand, if each of the X and Y components is within the respective acceptable range, a center point of the package substrate is determined from the first and second references. In that case, a center point of the IC die is aligned to the center point of the package substrate for coarse alignment as the IC die is placed onto the package substrate. For fine alignment, distances of solder bumps on the IC die to edges of the IC die are also determined.

In this manner, the fiducials are used by robotic vision tools and a robotic placement mechanism to place the IC die onto the package substrate with desired alignment. Each of the X and Y components of the distance between the reference points of the fiducials is verified to be within the respective acceptable range. In addition, distances of solder bumps on the IC die to edges of the IC die are also determined for fine alignment. Furthermore, the fiducials are comprised of dots having a same size as the pads on the package substrate to provide more accurate alignment from consistency between the size of the reference markings (i.e. the dots of the fiducials) and the objects to be aligned (i.e., the solder bumps of the IC die and the pads of the package substrate).

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1–25 refer to elements having similar structure and function.

DETAILED DESCRIPTION

Figure 6:
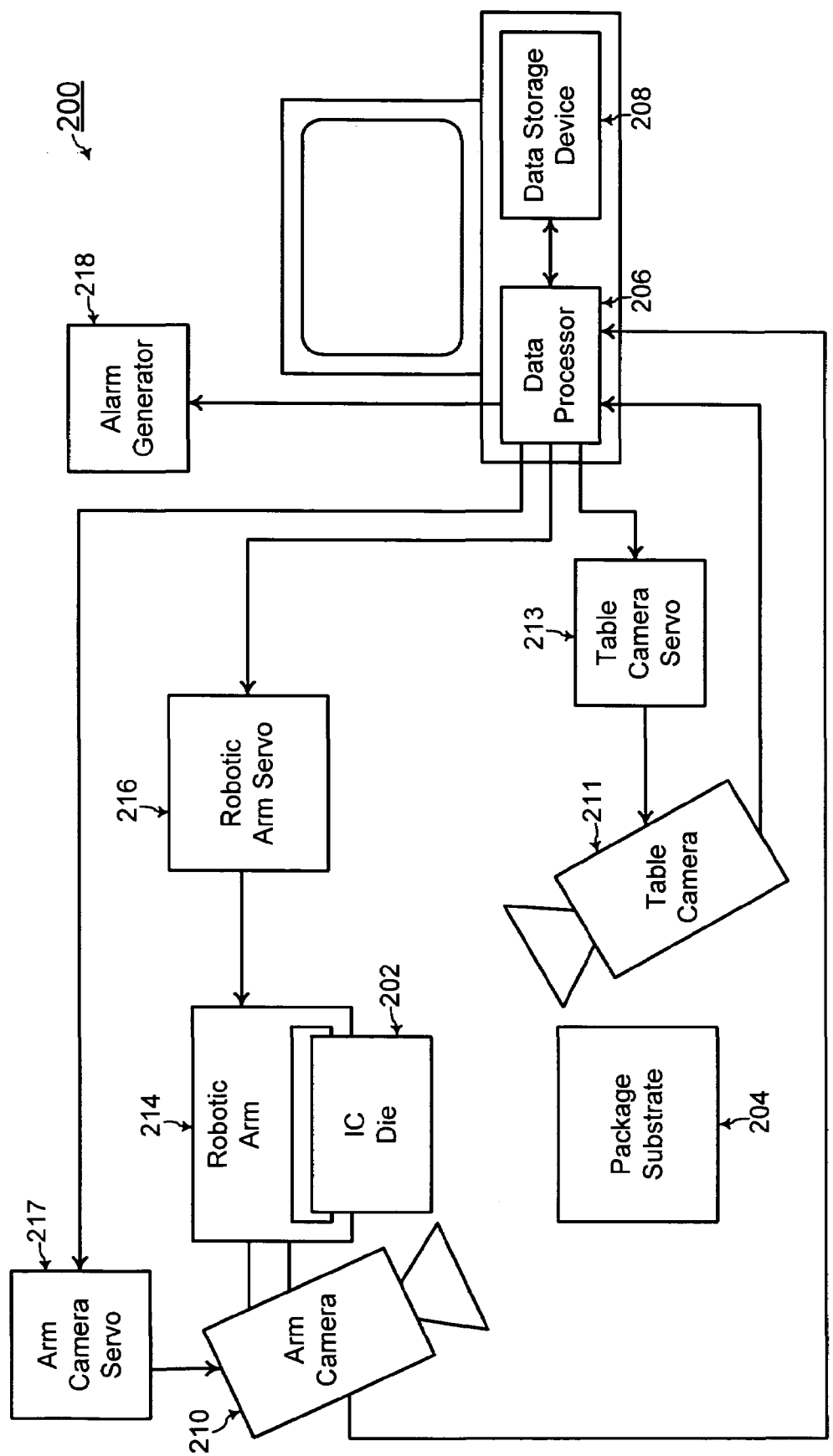
FIG. 6 illustrates a block diagram of a system for placing an IC die onto a package substrate with desired alignment using fiducials on the package substrate, according to an embodiment of the present invention.
Figure 13:
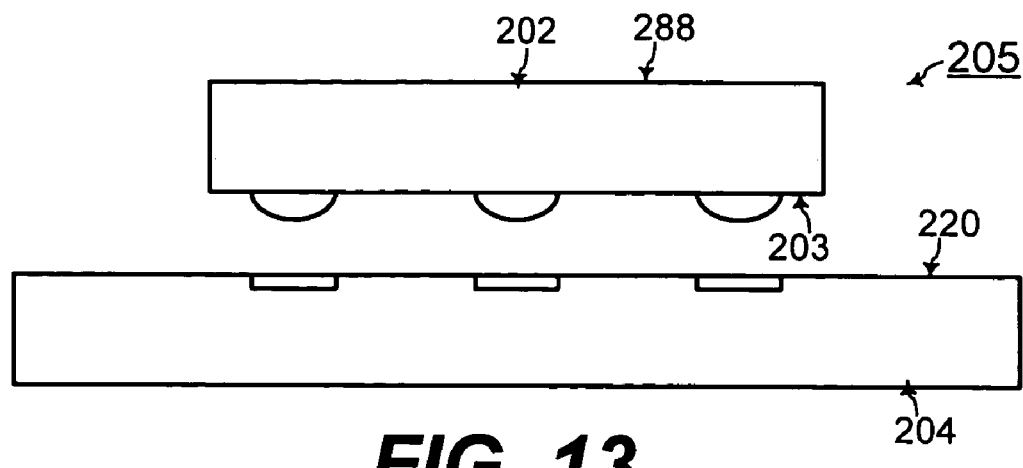
FIG. 13 shows a side view as the IC die is placed onto the package substrate in FIG. 12, according to an embodiment of the present invention.

Referring to FIGS. 6 and 13, a block diagram of a system 200 of FIG. 6 includes components for placing an IC (integrated circuit) die 202 onto a package substrate 204 with desired alignment for manufacture of an IC package 205 of FIG. 13, according to an embodiment of the present invention. The IC die 202 has a plurality of solder bumps formed on a bottom surface 203 (similar to the solder bumps 106A-106I described in reference to the IC die 102 of FIG. 1) to be mounted to a plurality of circular pads exposed on a top surface 220 of the package substrate 204 (similar to the circular pads 108A-108I described in reference to the package substrate 104 of FIG. 1).

The system 200 includes a data processor 206 and a data storage device 208. The data processor 206 is coupled to the data storage device 208 that stores data and instructions to be executed by the data processor 206 and that may also store temporary variables during execution of instructions by the data processor 206. For example, the data processor 206 and the data storage device 208 may be components of a computer system that is in general individually known to one of ordinary skill in the art. The data storage device 208 may include a static storage device of the computer system such as a ROM (read only memory) device, a main memory of the computer system such as a RAM (random access memory) device, and/or any other type of data storage device such as a floppy disc or a compact disc, as generally known to one of ordinary skill in the art.

In addition, the system 200 includes an arm camera 210 for generating an image of a field of view of the package substrate 204. An arm camera servo 217 is coupled between the arm camera 210 and the data processor 206 for controlling movement of the arm camera 210. The data processor 206, the arm camera 210, and the arm camera servo 217 comprise a first robotic vision tool. Similarly, the system 200 includes a table camera 211 for generating an image of a field of view of solder bumps on the IC die 202. A table camera servo 213 is coupled between the table camera 211 and the data processor 206 for controlling movement of the table camera 211. The data processor 206, the table camera 211, and the table camera servo 213 comprise a second robotic vision tool.

Furthermore, the system 200 includes a robotic arm 214 for handling the IC die 202 and for carrying the arm camera 210. A robotic arm servo 216 is coupled between the robotic arm 214 and the data processor 206 for controlling movement of the robotic arm 214. Additionally, an alarm generator 218 is coupled to the data processor 206. The components 210, 211, 212, 213, 214, 216, 217, and 218 in the system 200 are in general individually known to one of ordinary skill in the art.

Figure 1:
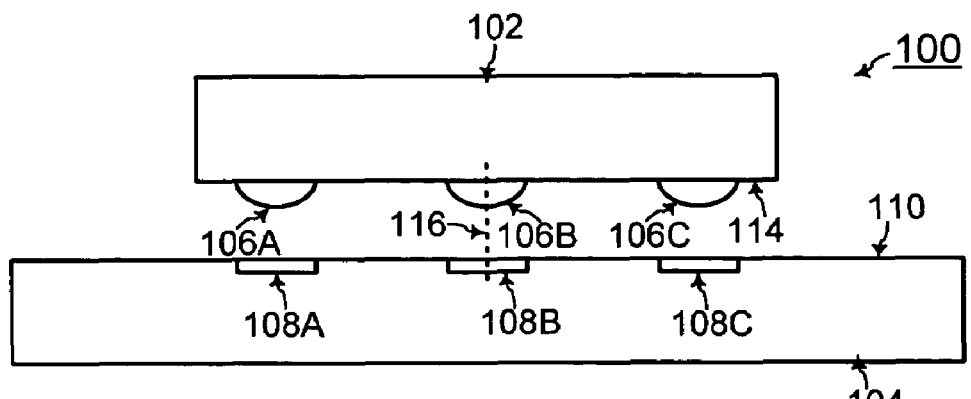
FIG. 1 shows a cross-sectional view of an IC die to be placed onto a package substrate during manufacture of an IC package, according to the prior art.
Figure 2:
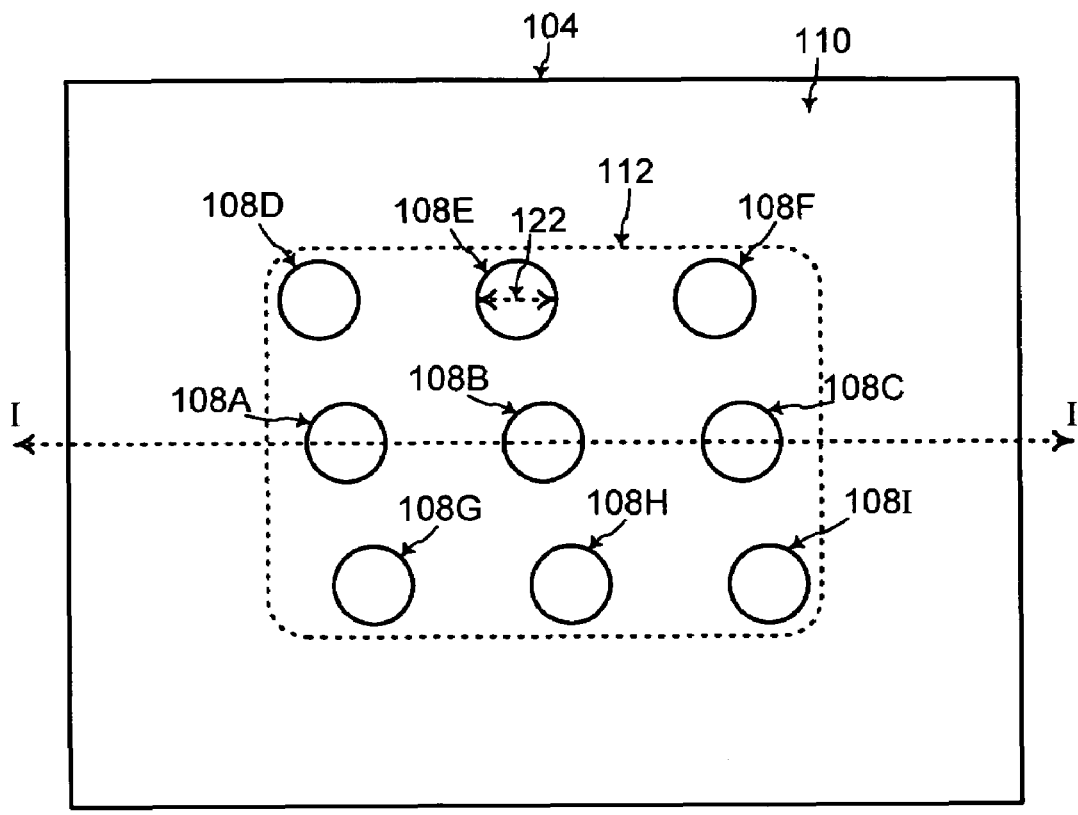
FIG. 2 shows a view of a top surface of the package substrate having a plurality of circular pads exposed thereon, according to the prior art.
Figure 3:
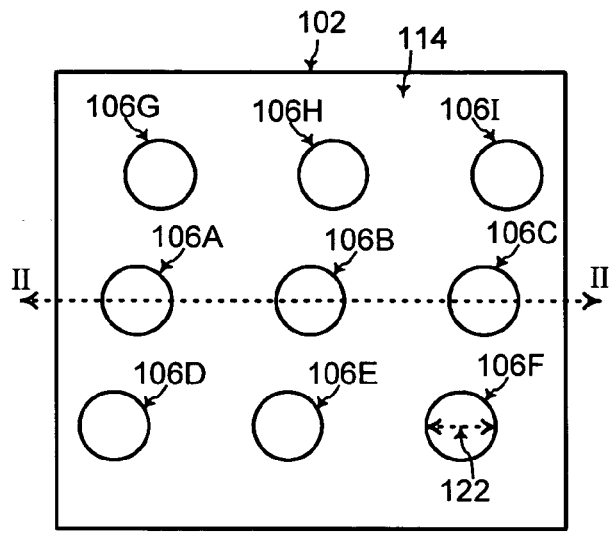
FIG. 3 shows a view of a bottom surface of the IC die having a plurality of solder bumps formed thereon, according to the prior art.
Figure 4:
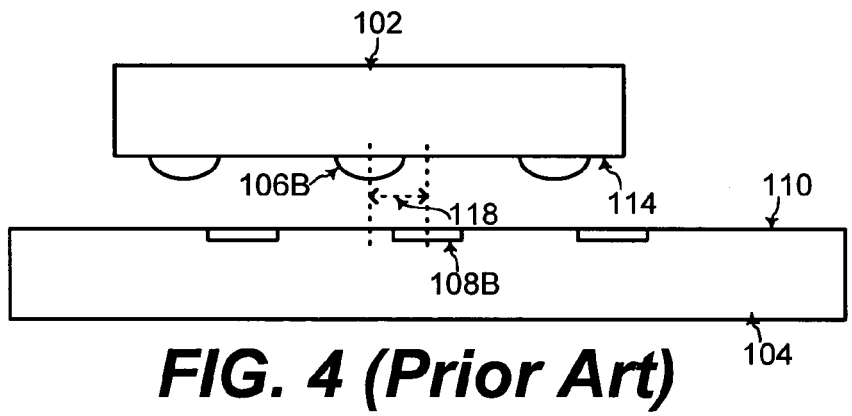
FIGS. 4 and 5 illustrate the cross-sectional view of FIG. 1 with misalignment between the IC die and the package substrate in a plurality of directions, according to the prior art.
Figure 5:
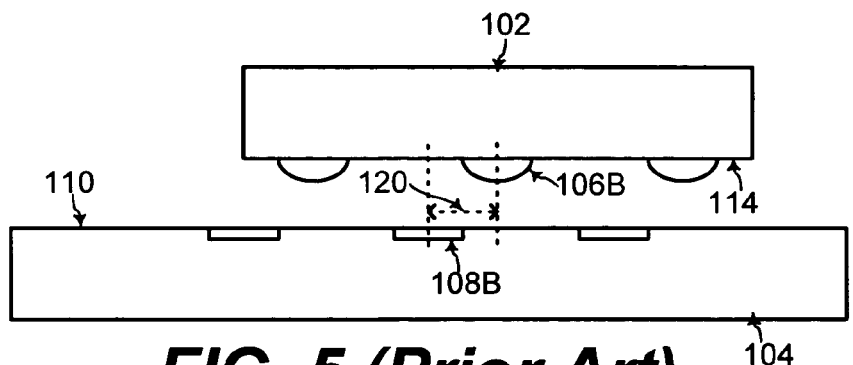
Figure 7:
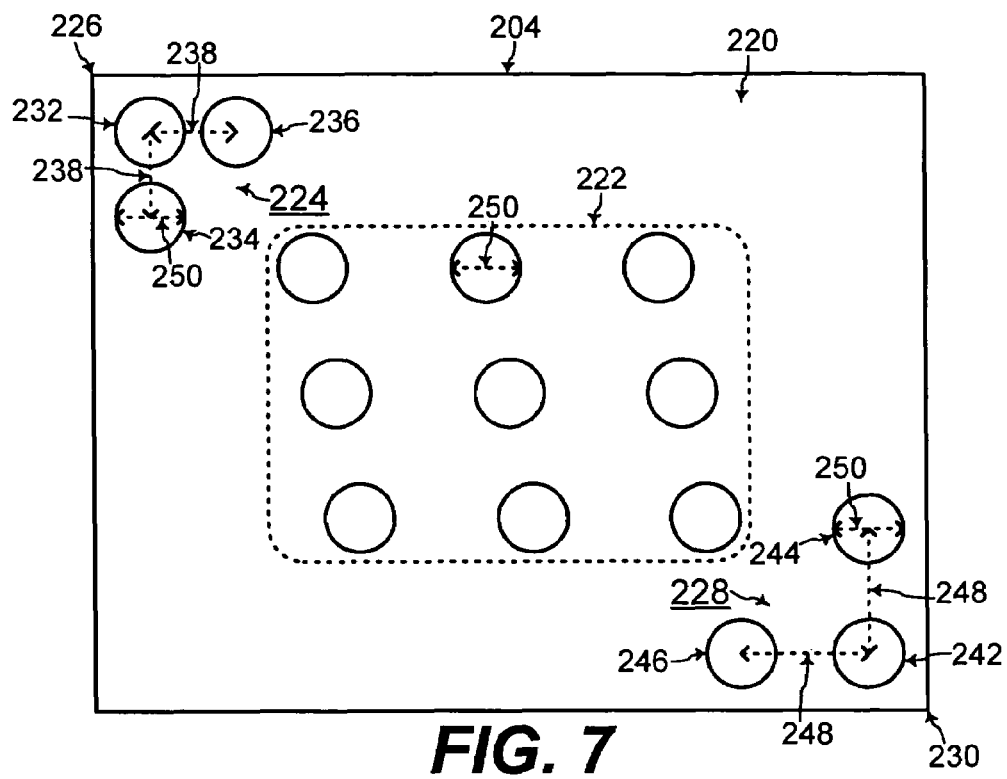
FIG. 7 illustrates two fiducials placed at diagonally opposite corners of the package substrate, according to an embodiment of the present invention.

FIG. 7 shows a view of a top surface 220 of the package substrate 204 having an area of a cage 222 with a plurality of circular pads exposed thereon (similar to the top surface 110 of the package substrate 104 in FIG. 1). However, the top surface 220 of the package substrate 204 according to an embodiment of the present invention additionally includes a first fiducial 224 located at a first location that is toward an upper left corner 226 of the package substrate 204. Additionally, the top surface 220 of the package substrate 204 also includes a second fiducial 228 located at a second location that is toward a lower right corner 230 of the package substrate 204.

In the embodiment of FIG. 7, the first and second fiducials 224 and 228 are disposed on diagonally opposite corners 226 and 230 of the package substrate 204. The first fiducial 224 includes a first corner dot 232 and first side dots 234 and 236. Each of the first side dots 234 and 236 is displaced from the first corner dot 232 by a first distance 238. In addition, the first fiducial 224 is configured with the first corner dot 232 being located as a corner of an "L" and with the two first side dots 234 and 236 being located as end-points of the "L".

Furthermore, a line formed from the center of the first corner dot 232 to the center of one 234 of the first side dots forms a right angle (i.e., a 90° angle) with respect to a line formed from the center of the first corner dot 232 to the center of the other 236 of the first side dots.

Similarly, the second fiducial 228 includes a second corner dot 242 and second side dots 244 and 246. Each of the second side dots 244 and 246 is displaced from the second corner dot 242 by a second distance 248. In one embodiment of the present invention, the second distance 248 between each of the second side dots 244 and 246 and the second corner dot 242 for the second fiducial 228 is different from the first distance 238 between each of the first side dots 234 and 236 and the first corner dot 232 for the first fiducial 224.

Also, the second fiducial 228 is configured with the second corner dot 242 being located as a corner of an "L" and with the two second side dots 244 and 246 being located as end-points of the "L". Furthermore, a line formed from the center of the second corner dot 242 to the center of one 244 of the second side dots forms a right angle (i.e., a 90° angle) with respect to a line formed from the center of the second corner dot 242 to the center of the other 246 of the second side dots.

In an embodiment of the present invention, the circular pads within the cage 222 and the dots 232, 234, 236, 242, 244, and 246 of the first and second fiducials 224 and 228 each have a same diameter 250. In an example embodiment of the present invention, each of the circular pads within the cage 222 and each of the dots 232, 234, 236, 242, 244, and 246 of the first and second fiducials 224 and 228 have a diameter 250 of about 100 μm (micrometers).

In that example embodiment, the first distance 238 between each of the first side dots 234 and 236 and the first corner dot 232 is about 0.25 mm (millimeter) for the first fiducial 224. The second distance 248 between each of the second side dots 244 and 246 and the second corner dot 242 is about 0.45 mm for the second fiducial 228. In addition, the dots 232, 234, 236, 242, 244, and 246 of the first and second fiducials 224 and 228 are disposed outside the cage 222 having the circular pads of the package substrate 204 therein.

Figure 9:
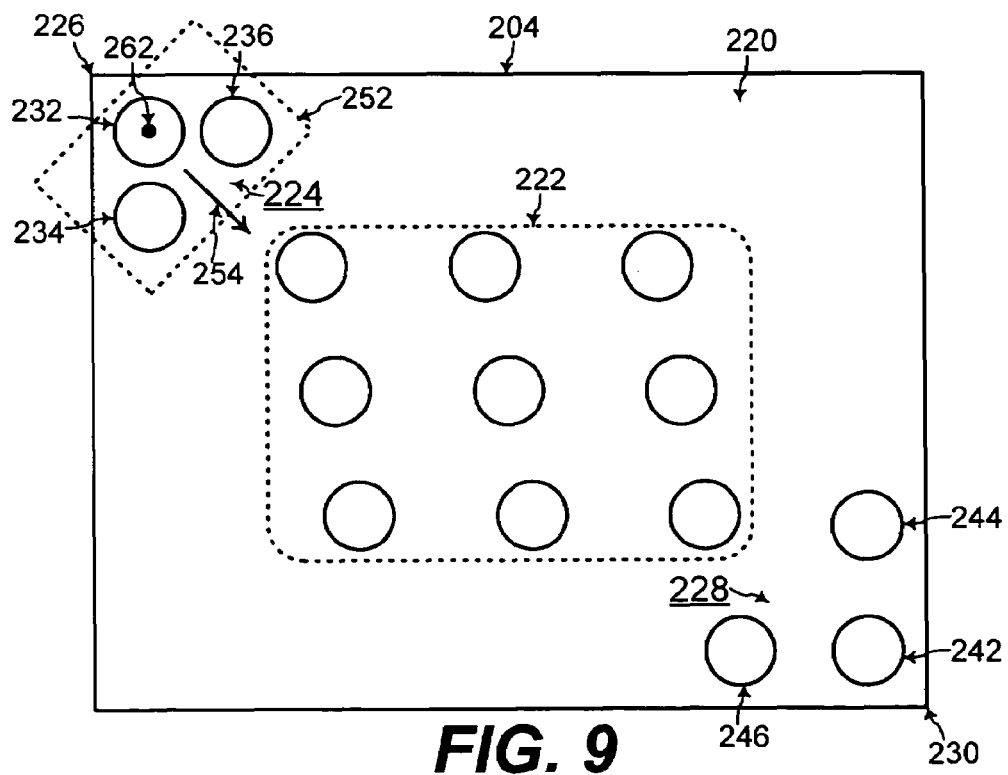
FIG. 9 illustrates a field of view of an arm camera searching toward a first angle from a first corner of the package substrate to locate a first fiducial, according to an embodiment of the present invention.
Figure 8:
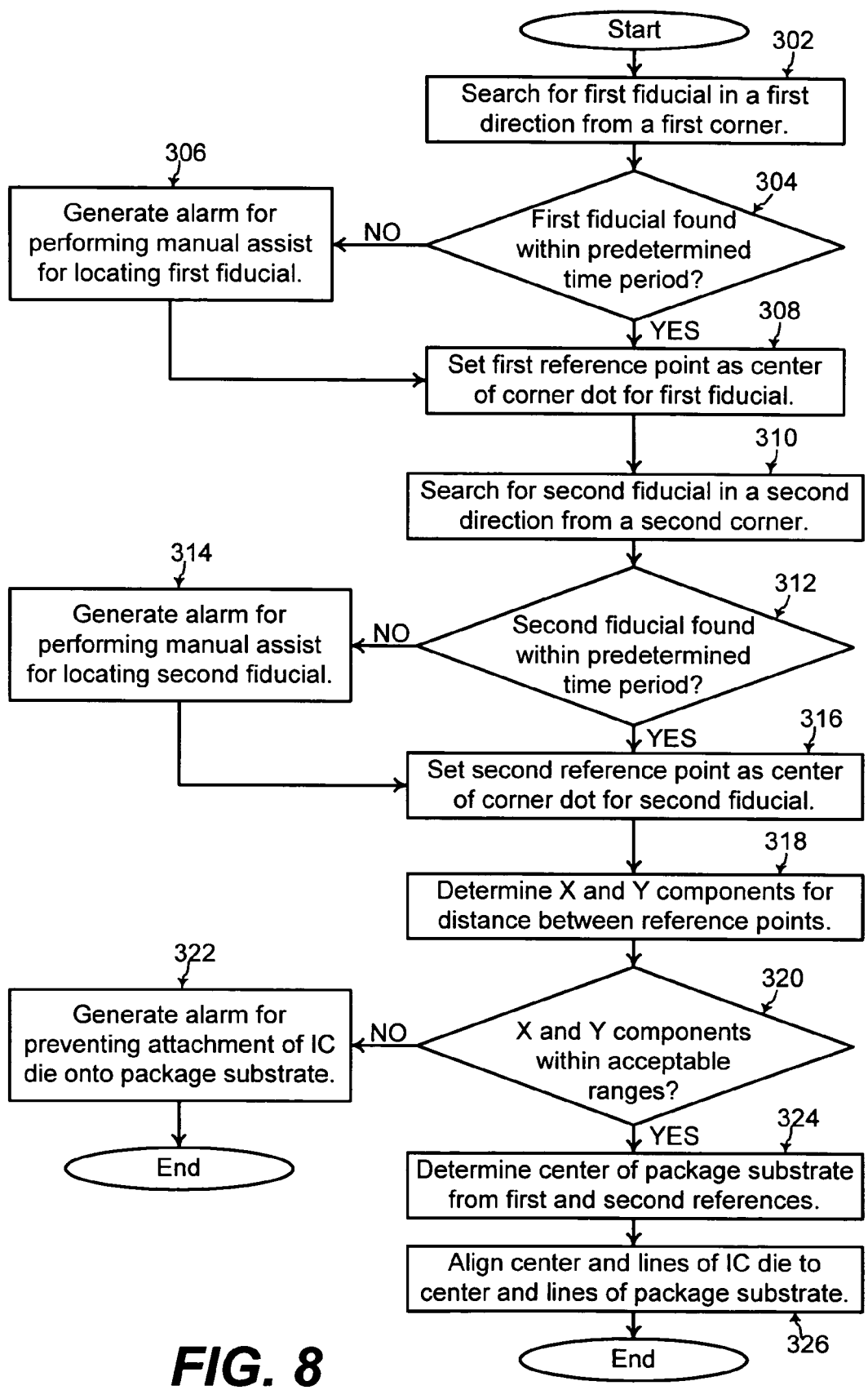
FIG. 8 illustrates a flow-chart of steps during operation of the system of 6, according to an embodiment of the present invention.

FIG. 8 shows a flow-chart of steps performed by the data processor 206 of FIG. 6 from execution of instructions stored in the data storage device 208 for using the fiducials 224 and 228 to align the IC package 202 to the package substrate 204, according to an embodiment of the present invention. Referring to FIGS. 6, 8, and 9, the data processor 206 controls the arm camera servo 217 to move the arm camera 210 such that a field of view 252 of the arm camera 210 starts at the upper left corner 226 of the package substrate 204.

In addition, the arm camera 210 is controlled such that the field of view 252 moves in a first direction (as illustrated by arrow 254 in FIG. 9) inward toward the center of the package substrate 204 from the upper left corner 226. The arm camera 210 captures the image within the field of view 252 and sends such an image to the data processor 206.

The data processor 206 analyzes the image of the field of view 252 from the arm camera 210 to locate the first corner dot 232 and the two first side dots 234 and 236 of the first fiducial 224 (step 302 of FIG. 8). For example, the data processor 206 searches for the two first side dots 234 and 236 each displaced from the first corner dot 232 by the first distance 238 within the imaged field of view 252 to determine that the first fiducial 224 is found. Applications such as image recognition software for analyzing images from a camera in general are individually known to one of ordinary skill in the art.

If the data processor 206 cannot find the first fiducial 224 from the imaged field of view 252 in such a manner within a predetermined time period (step 304 of FIG. 8), the data processor 206 generates an alarm with the alarm generator 218 (step 306 of FIG. 8). The alarm generator 218 may generate a visual alarm such as a flashing light or an error message on a GUI (graphical user interface) display or an audio alarm such as siren sounds for example.

When such an alarm is generated, an operator manually assists in the movement of the arm camera 210 until the three dots 232, 234, and 236 of the first fiducial 224 are within the field of view 252 of the arm camera 210. With such manual assistance, the data processor 206 locates the first fiducial 224 when the dots 232, 234, and 236 of the first fiducial 224 are placed within the field of view 252 of the arm camera 210 by the operator.

In any case, after the data processor 206 locates the first fiducial 224, the data processor 206 sets a first reference point 262 as a center of the first corner dot 232 of the first fiducial 224 (step 308 of FIG. 8). In addition, after the data processor 206 finds the first fiducial 224, the data processor 206 stores an image file in the data storage device 208 recording information such as the dimensions and locations of the dots 232, 234, and 236 comprising the first fiducial 224.

Figure 10:
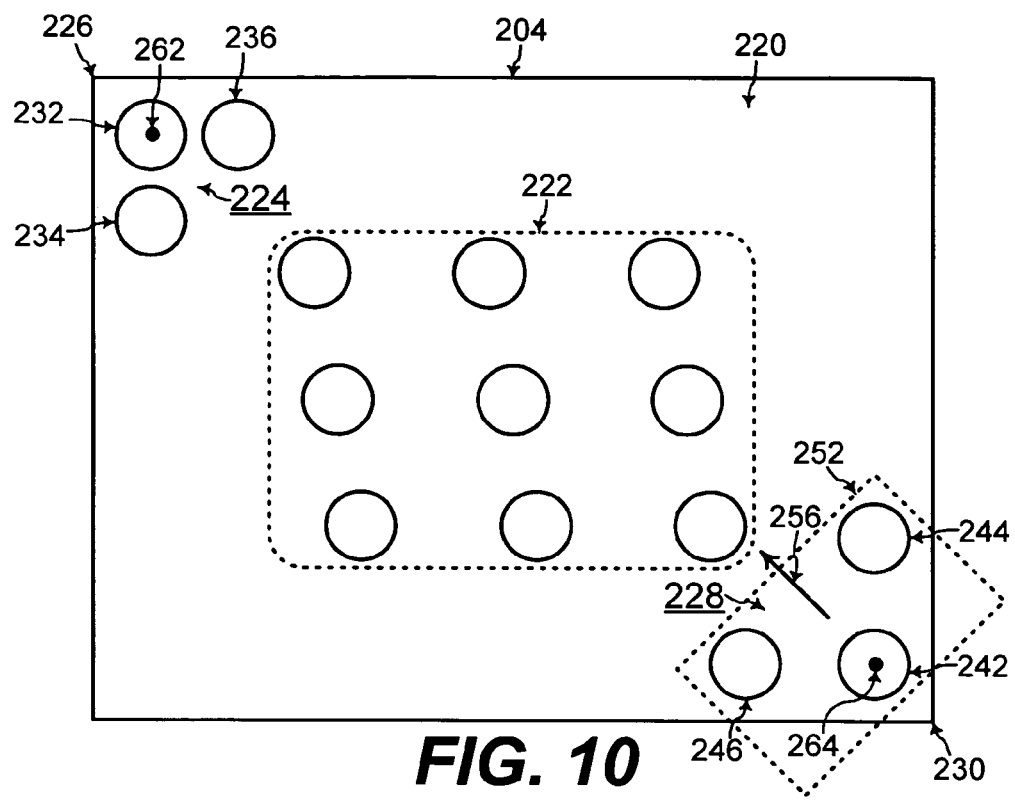
FIG. 10 illustrates the field of view of the arm camera searching toward a second angle from a second corner of the package substrate to locate a second fiducial, according to an embodiment of the present invention.

Similarly, referring to FIG. 10, the data processor 206 controls the arm camera servo 217 to move the arm camera 210 such that the field of view 252 of the arm camera 210 starts at the lower right corner 230 of the package substrate 204. In addition, the arm camera 210 is controlled such that the field of view 252 moves in a second direction (as illustrated by arrow 256 in FIG. 10) inward toward the center of the package substrate 204 from the lower right corner 230.

The data processor 206 analyzes the image of the field of view 252 from the arm camera 210 to locate the second corner dot 242 and the second side dots 244 and 246 of the second fiducial 228 (step 310 of FIG. 8). For example, the data processor 206 searches for the two second side dots 244 and 246 each displaced from the second corner dot 242 by the second distance 248 within the imaged field of view 252 to determine that the second fiducial 228 is found.

If the data processor 206 cannot find the second fiducial 228 from the imaged field of view 252 in such a manner within a predetermined time period (step 312 of FIG. 8), the data processor 206 generates an alarm with the alarm generator 218 (step 314 of FIG. 8). When such an alarm is generated, an operator manually assists in the movement of the arm camera 210 until the three dots 242, 244, and 246 of the second fiducial 228 are within the field of view 252 of the arm camera 210. With such manual assistance, the data processor 206 locates the second fiducial 228 when the dots 242, 244, and 246 of the second fiducial 228 are placed within the field of view 252 of the arm camera 210 by the operator.

In any case, after the data processor 206 locates the second fiducial 228, the data processor 206 sets a second reference point 264 as a center of the second corner dot 242 of the second fiducial 228 (step 316 of FIG. 8). In addition, after the data processor 206 finds the second fiducial 228, the data processor 206 stores an image file in the data storage device 208 recording information such as the dimensions and locations of the dots 242, 244, and 246 comprising the second fiducial 228.

In this manner, the first robotic vision tool comprised of the data processor 206, the arm camera 210, and the arm camera servo 217 locates the first and second fiducials 224 and 228 and determines the first and second reference points 262 and 264. The dots 232, 234, and 236 of the first fiducial 224 are distinguishable from the circular pads within the cage 222 of the package substrate 204 because of the distinct first distance 238 and positions of the fist side dots 234 and 236 from the first corner dot 232. Similarly, the dots 242, 244, and 246 of the second fiducial 228 are distinguishable from the circular pads within the cage 222 of the package substrate 204 because of the distinct second distance 248 and positions of the second side dots 244 and 246 from the second corner dot 242.

In addition, the dots 232, 234, and 236 of the first fiducial 224 are distinguishable from the dots 242, 244, and 246 of the second fiducial 228 because the first and second fiducials 224 and 228 are disposed toward diagonally opposite corners 226 and 230 of the package substrate 204. In addition, the first and second fiducials 224 and 228 are distinguishable because the first distance 238 between each of the first side dots 234 and 236 and the first corner dot 232 for the first fiducial 224 is different from the second distance 248 between each of the second side dots 244 and 246 and the second corner dot 242 for the second fiducial 228.

Figure 11:
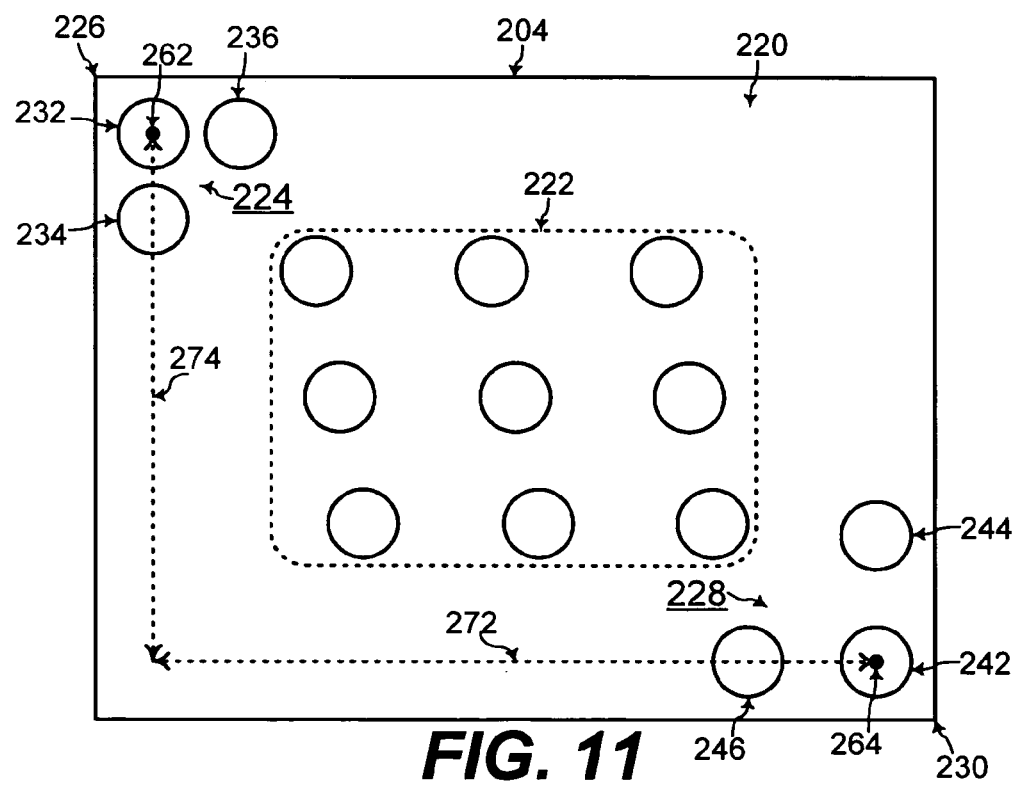
FIG. 11 illustrates determining X and Y components of a distance between a first reference point of the first fiducial and a second reference point of the second fiducial, according to an embodiment of the present invention.

Referring to FIGS. 8 and 11, after the data processor 206 determines the first and second reference points 262 and 264 for the first and second fiducials 224 and 228, the data processor 206 determines an X-component 272 and a Y-component 274 of the distance between the first and second reference points 262 and 264 (step 318 of FIG. 8). The data processor 206 then determines whether each of the X-component 272 and the Y-component 274 are within a respective acceptable range (step 320 of FIG. 8).

The respective acceptable range for each of the X-component 272 and the Y-component 274 are determined from the CAD (computer assisted design) dimensions selected during design for forming the first and second fiducials 224 and 228 on the package substrate 204. For example, the respective acceptable range for the X-component 272 may be 5.0 mm (milli-meters)±0.2 mm, and the respective acceptable range for the Y-component 274 may be 4.0 mm (milli-meters)±0.2 mm.

If the data processor 206 determines that any of the X-component 272 and the Y-component 274 is not within the respective acceptable range, the data processor 206 generates an alarm with the alarm generator 218 (step 322 of FIG. 8) and ends operation. Such an alarm indicates that the IC die 202 may not be aligned to the package substrate 204 within an acceptable level.

Thus, the operator is notified of such a faulty condition such that attachment of the IC die 202 onto the package substrate 204 with such unacceptable misalignment is prevented. Upon generation of the alarm, an operator may reset the system 200 such that the data processor 206 may re-attempt to determine the first and second reference points from the first and second fiducials 224 and 228. Alternatively, the operator may attempt to determine and correct for the underlying cause that led to the unacceptable misalignment.

Figure 12:
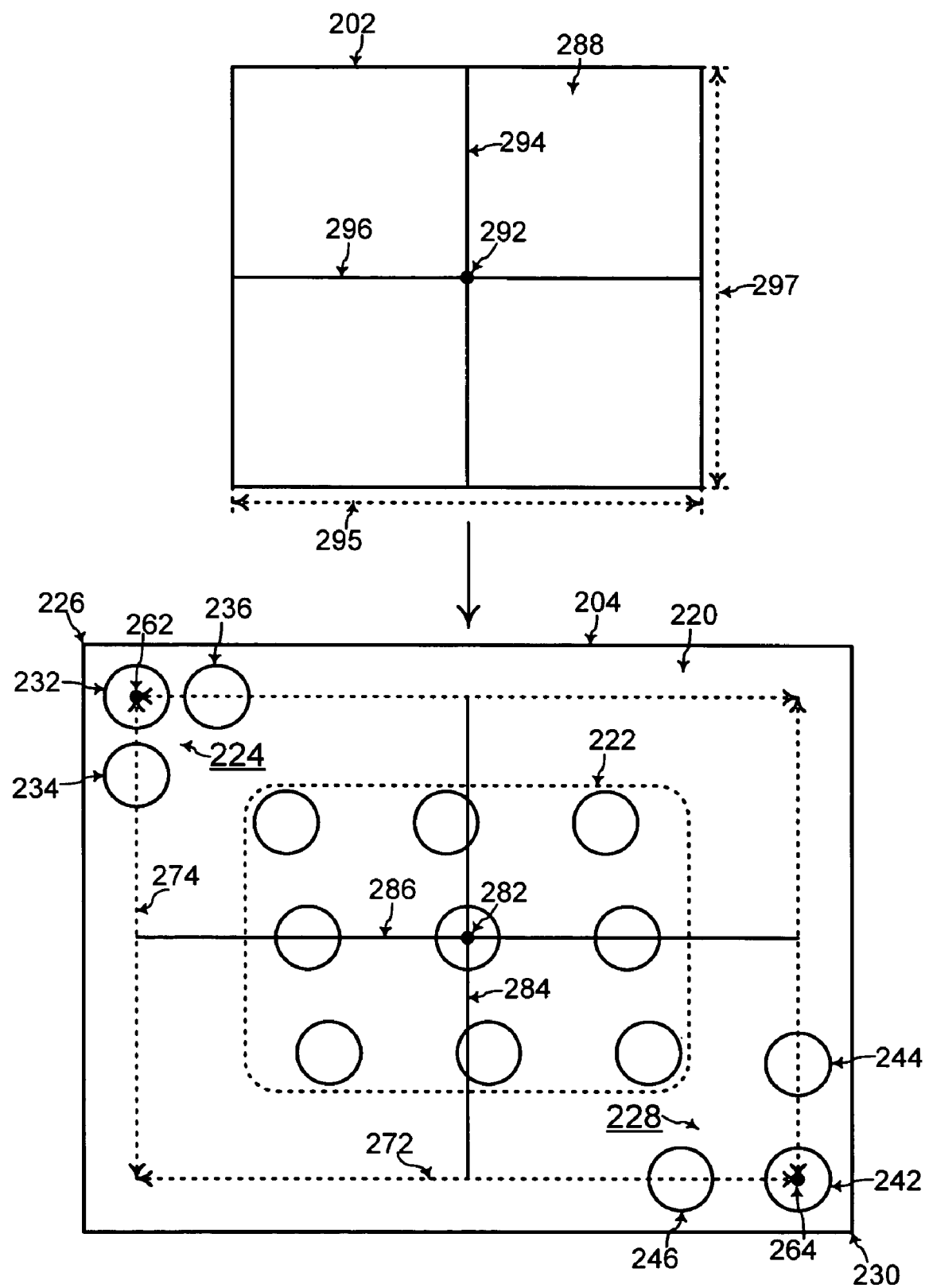
FIG. 12 shows a center point of the IC die to be aligned to a center point of the package substrate as determined using the first and second reference points of the first and second fiducials, according to an embodiment of the present invention.

On the other hand, referring to FIGS. 8 and 12, if the data processor 206 determines that each of the X and Y components 272 and 274 are within the respective acceptable range (step 320 of FIG. 8), the data processor 206 determines a center point 282 of the package substrate 204 as the intersection point between a first substrate line 284 running perpendicular to the mid-point of the X-component 272 and a second substrate line 286 running perpendicular to the mid-point of the Y-component 274 (step 324 of FIG. 8).

Referring to FIGS. 12 and 13, for placing the IC die 202 onto the package substrate 204 with desired alignment, a center point 292 of a top surface 288 of the IC die 202 is determined. The top surface 288 of the IC die 202 is opposite to the bottom surface 203 of the IC die 202 having the solder bumps formed thereon. The center point 292 of the IC die 202 is determined as the intersection point between a first die line 294 running perpendicular to the mid-point of an X-dimension 295 of the top surface 288 of the IC die 202 and the second die line 296 running perpendicular to the mid-point of a Y-dimension 295 of the top surface 288 of the IC die 202.

Figure 14:
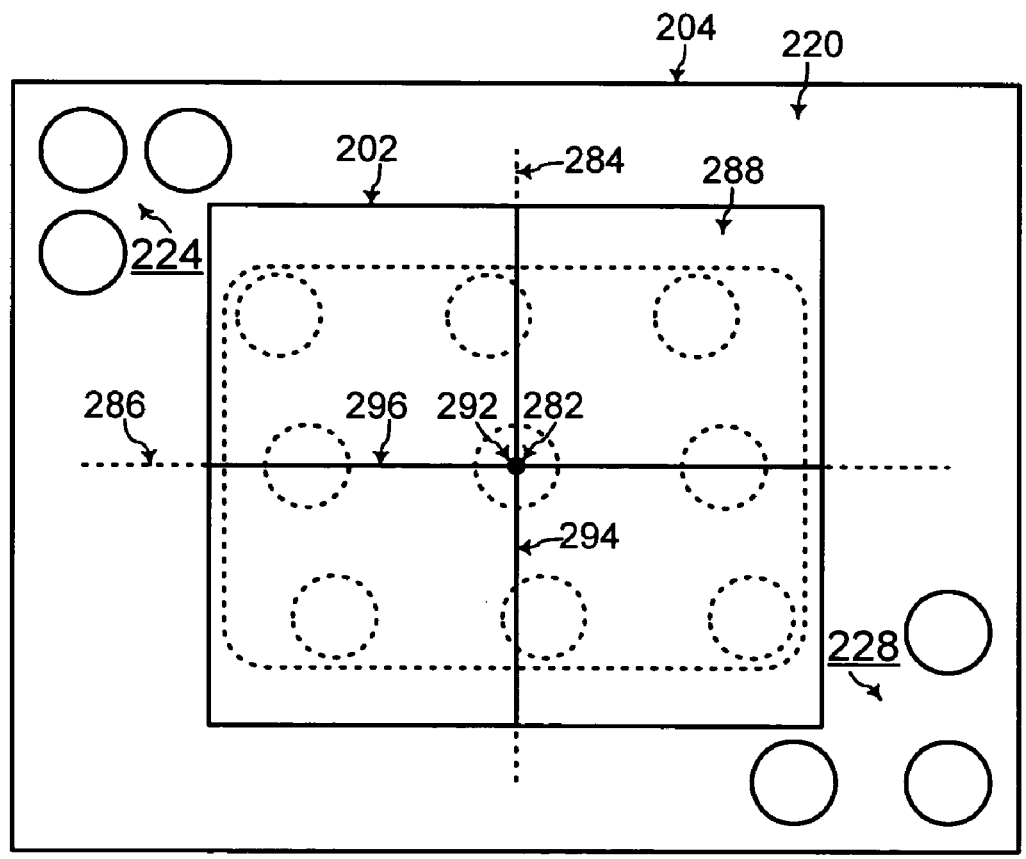
FIG. 14 illustrates alignment of the center point of the IC die to the center point of the package substrate for coarse alignment, according to an embodiment of the present invention.

Referring to FIGS. 12, 13, and 14, the data processor 206 controls the robotic arm servo 216 to move the robotic arm 214 carrying the IC die 202 onto the package substrate 204. The robotic arm 214 places the bottom surface 203 of the IC die 202 having solder bumps formed thereon to face the upper surface 220 of the package substrate 204 having circular pads exposed thereon.

In addition, as the robotic arm 214 places the IC die 202 onto the package substrate 204, the center point 292 of the IC die 202 and the first and second die lines 294 and 296 are formed by the data processor 206 onto the image of the IC die 202 within the field of view of the arm camera 210. Furthermore, the data processor 206 forms the center point 282 of the package substrate 204 and the first and second substrate lines 284 and 286 onto the image of the package substrate 204 within the field of view of the arm camera 210.

For aligning the IC die 202 to the package substrate 204, the data processor 206 controls the robotic arm 214 via the robotic arm servo 216 to move the IC die 202 with respect to the package substrate 204 until the center point 292 of the IC die 202 is on top of the center point 282 of the package substrate 204 as illustrated in FIG. 14 (step 326 of FIG. 8). In addition, for rotational alignment, the data processor 206 controls the robotic arm 214 to move the IC die 202 until the first die line 294 is aligned to the first substrate line 284 and/or until the second die line 296 is aligned to the second substrate line 286 as illustrated in FIG. 14.

In this manner, the data processor 206, the robotic arm servo 216, and the robotic arm 214 comprise a robotic placement mechanism for placing the IC die 202 onto the package substrate 204. Furthermore, the fiducials 224 and 228 are used by the first robotic vision tool and the robotic placement mechanism to place the IC die 202 onto the package substrate 204 with desired alignment. With such alignment, solder bumps of the IC die 202 are aligned to the circular pads of the package substrate 204 for minimized resistance through the couplings of the solder bumps to the circular pads.

After the IC die 202 is placed onto the package substrate 204 with such alignment, a die attach is used for holding the IC die 202 to the package substrate 204 with such alignment. Then, a reflow process is performed to join the solder bumps of the IC die 202 to the circular pads of the package substrate 204. Such a die attach and such a reflow process are in general individually known to one of ordinary skill in the art.

Verification that each of the X and Y components 272 and 274 between the reference points 262 and 264 is within the respective acceptable range ensures that any misalignment between the IC die 202 and the package substrate 204 is less than an undesirable level. In addition, the fiducials 224 and 228 are comprised of dots 232, 234, 236, 242, 244, and 246 having a same size as the circular pads on the package substrate 204 to provide more accurate alignment from consistency between the size of the reference markings (i.e. the dots of the fiducials 224 and 228) and the objects to be aligned (i.e., the solder bumps of the IC die 202 and the circular pads of the package substrate 204).

The foregoing is by way of example only and is not intended to be limiting. Any numbers specified herein are by way of example only. For example, the present invention may be practiced with any number of fiducials having any number of dots with any type of references at other locations aside from the example of the reference points 262 and 264. In addition, the fiducials may be comprised of any other type of markings having different appearances from the three dots illustrated as embodiments of the present invention herein. Furthermore, any dimensions specified herein are by way of example only. Additionally, the present invention may also be practiced when the solder bumps on the IC die 202 and the pads of the package substrate 204 have different shapes and dimensions with correspondingly different shapes and dimensions of the fiducial markings from the circular examples illustrated and described herein.

Figure 15:
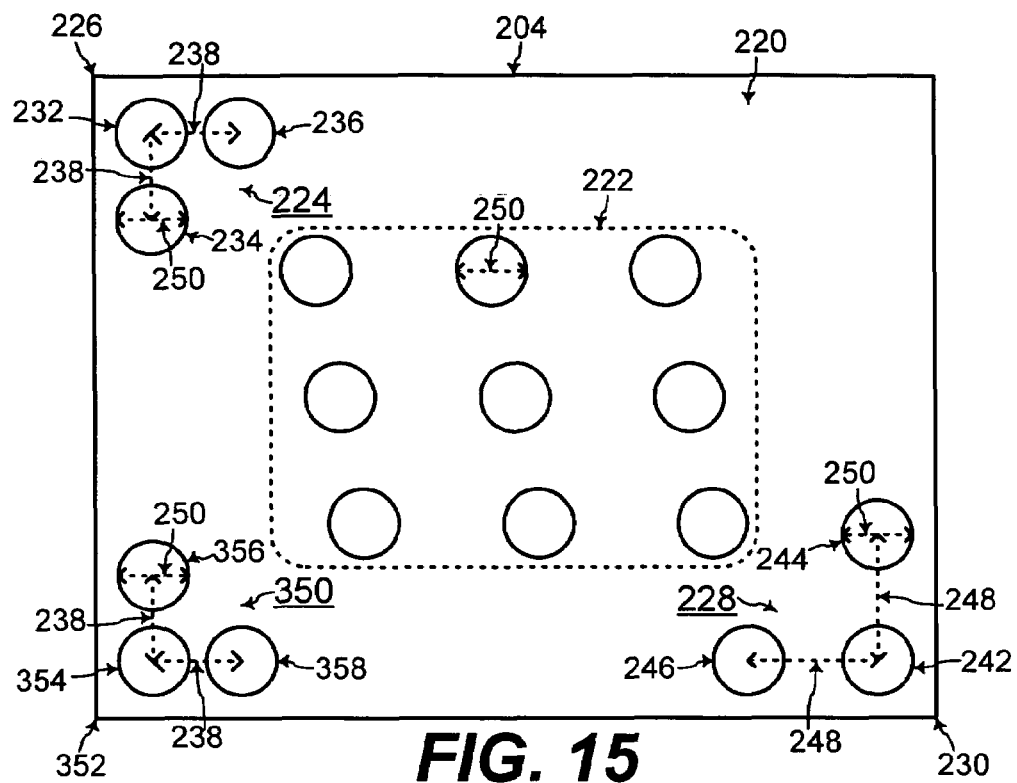
FIG. 15 illustrates three fiducials placed at three corners of the package substrate, according to another embodiment of the present invention.
Figure 17:
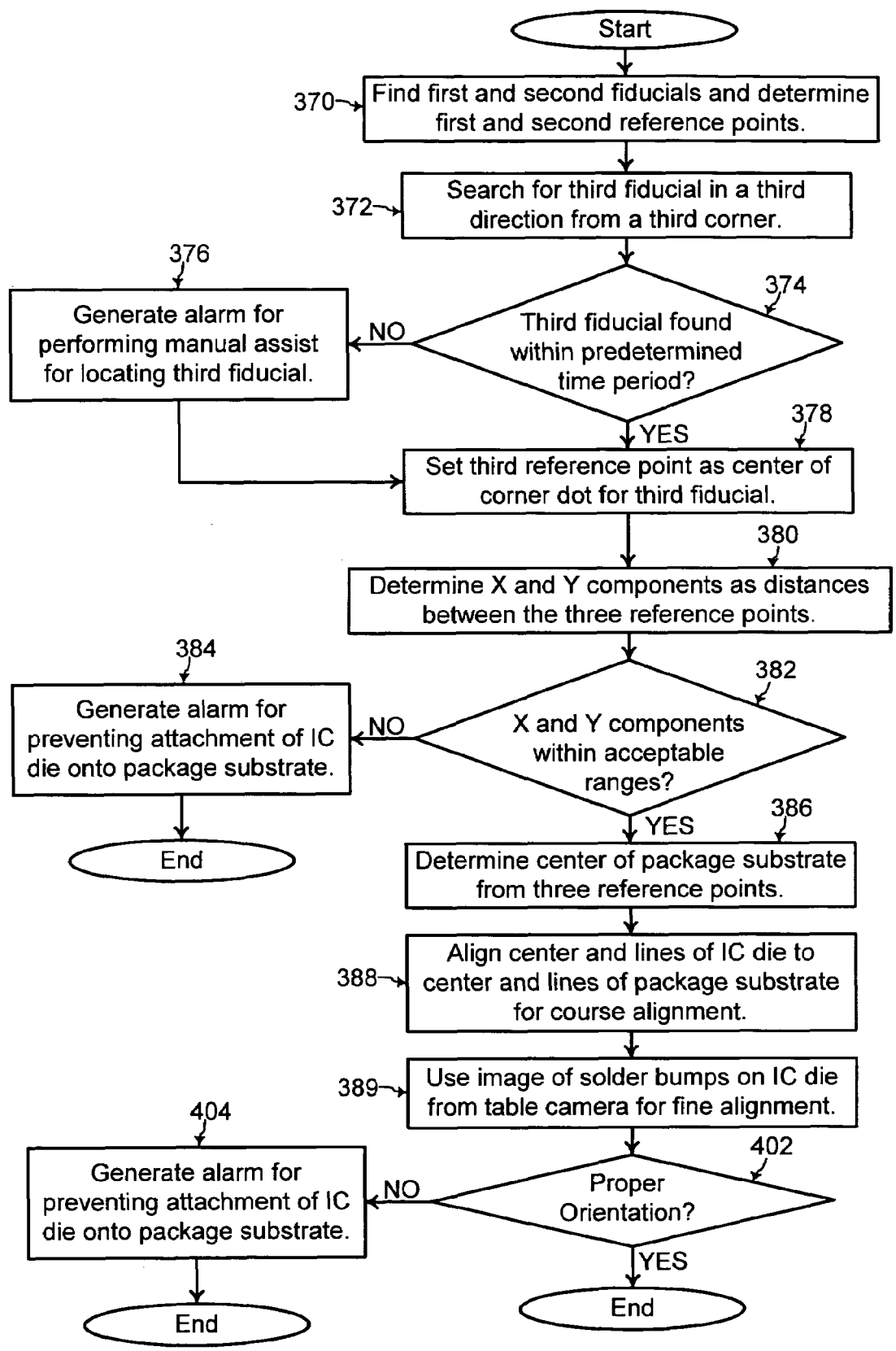
FIG. 17 illustrates a flow-chart with extended steps from the flow-chart of FIG. 8 for fine alignment during operation of the system of 6, according to a further embodiment of the present invention.

FIG. 15 illustrates an alternative embodiment of the package substrate 204 having an additional third fiducial 350 in addition to the first and second fiducials 224 and 228 of FIG. 7. FIG. 17 illustrates a flowchart of additional steps from the flowchart of FIG. 8 using the third fiducial 350 for ensuring further alignment between the IC die 202 and the package substrate 204.

Referring to FIG. 15, the third fiducial 350 is placed at a third corner 352 of the package substrate 204. The third fiducial 350 is similar to the first fiducial 224 and is comprised of a third corner dot 354 and third side dots 356 and 358. Similar to the dots of the first fiducial 224, each of the third side dots 356 and 358 is displaced from the third corner dot 354 by the first distance 238 for the third fiducial 350.

In addition, the third fiducial 350 is configured with the third corner dot 354 being located as a corner of an "L" and with the two third side dots 356 and 358 being located as end-points of the "L". Furthermore, a line formed from the center of the third corner dot 354 to the center of one 356 of the third side dots forms a right angle (i.e., a 90° angle) with respect to a line formed from the center of the third corner dot 354 to the center of the other 358 of the third side dots.

Referring to FIGS. 8 and 17, the first and second reference points 262 and 264 of the first and second fiducials 224 and 228, respectively, are determined according to the steps of the flowchart of FIG. 8 as already described herein (step 370 of FIG. 17). In addition, referring to FIGS. 6, 16, and 17, the data processor 206 controls the arm camera servo 217 to move the arm camera 210 such that the field of view 252 of the arm camera 210 starts at the lower left corner 352 of the package substrate 204. In addition, the arm camera 210 is controlled such that the field of view 252 moves in a third direction (as illustrated by arrow 360 in FIG. 16) inward toward the center of the package substrate 204 from the lower left corner 352.

The data processor 206 analyzes the imaged field of view 252 from the arm camera 210 to locate the third corner dot 354 and the third side dots 356 and 358 of the third fiducial 350 (step 372 of FIG. 17). For example, the data processor 206 searches for the two third side dots 356 and 358 each displaced from the third corner dot 354 by the first distance 238 within the imaged field of view 252 to determine that the third fiducial 350 is found.

If the data processor 206 cannot find the third fiducial 350 from the imaged field of view 252 in such a manner within a predetermined time period (step 374 of FIG. 17), the data processor 206 generates an alarm with the alarm generator 218 (step 376 of FIG. 17). When such an alarm is generated, an operator manually assists in the movement of the arm camera 210 until the three dots 354, 356, and 358 of the third fiducial 350 are within the field of view 252 of the arm camera 210. With such manual assistance, the data processor 206 locates the third fiducial 350 when the dots 354, 356, and 358 of the third fiducial 350 are placed within the field of view 252 of the arm camera 210 by the operator.

In any case, after the data processor 206 locates the third fiducial 350, the data processor 206 sets a third reference point 362 as a center of the third corner dot 354 of the third fiducial 350 (step 378 of FIG. 8). In addition, after the data processor 206 finds the third fiducial 350, the data processor 206 stores an image file in the data storage device 208 recording information such as the dimensions and locations of the dots 354, 356, and 358 comprising the third fiducial 350.

Figure 16:
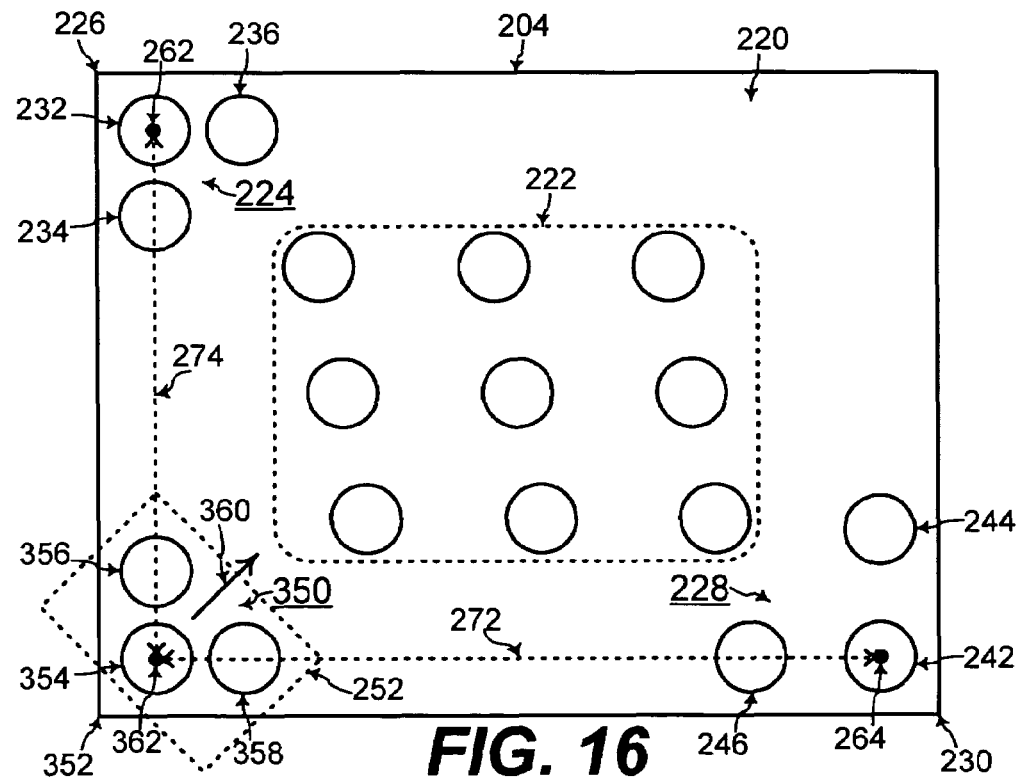
FIG. 16 illustrates the field of view of the arm camera searching toward a third angle from a third corner of the package substrate to locate a third fiducial, according to an embodiment of the present invention.

Referring to FIGS. 16 and 17, after the data processor 206 determines the first, second, and third reference points 262, 264, and 362 for the first, second, and third fiducials 224, 228, and 350, respectively, the data processor 206 determines the X-component 272 and the Y-component 274 (step 380 of FIG. 17). In FIG. 16, the X-component 272 is determined as the distance between the second and third reference points 264 and 362, and the Y-component 274 is determined as the distance between the first and third reference points 262 and 362. Such X and Y components 272 and 274 are more accurately determined in the embodiment of FIG. 16 using the three reference points 262, 264, and 362.

The data processor 206 then determines whether each of the X-component 272 and the Y-component 274 is within a respective acceptable range (step 382 of FIG. 17) similar to step 320 of FIG. 8. If the data processor 206 determines that any of the X and Y components 272 and 274 is not within the respective acceptable range, the data processor 206 generates an alarm with the alarm generator 218 (step 384 of FIG. 17) and ends operation similar to step 322 of FIG. 8.

Referring to FIGS. 14, 16, and 17, if the data processor 206 determines that each of the X and Y components 272 and 274 is within the respective acceptable range (step 382 of FIG. 17), the data processor 206 determines the center point 282 of the package substrate 204 from the X and Y components 272 and 274 in FIG. 16 (step 386 of FIG. 17) similar to step 324 of FIG. 8. In addition, the center point 292 and the die lines 294 and 296 of the IC die 202 are aligned to the center point 282 and the substrate lines 284 and 286 of the package substrate 204 during placement of the IC die 202 onto the package substrate 204 (step 388 of FIG. 17) similar to step 326 of FIG. 8.

Figure 18:
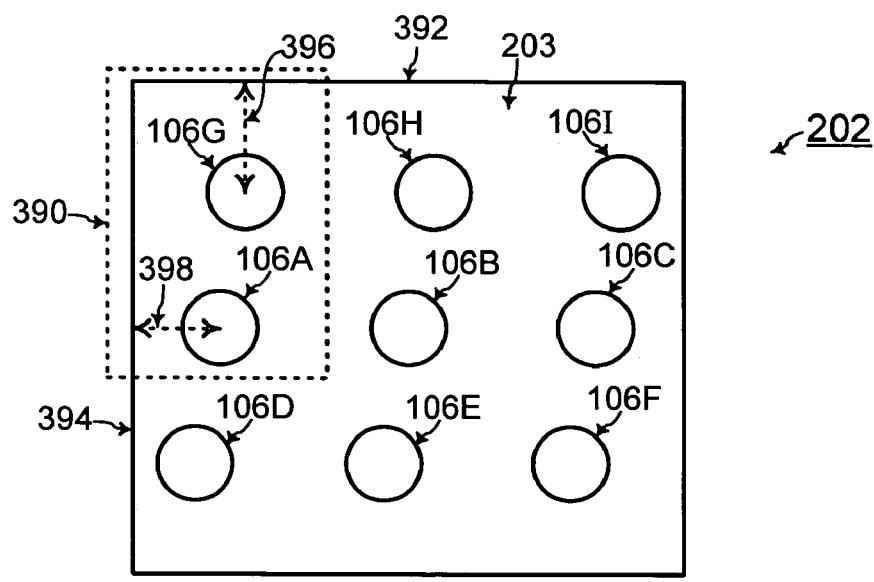
FIG. 18 illustrates a field of view of a table camera for determining distances of solder bumps on the IC die from edges of the IC die for fine alignment of the IC die to the package substrate, according to another embodiment of the present invention.

In a further embodiment of the present invention, alignment of the center point 292 and the lines 294 and 296 of the IC die 202 to the center point 282 and the lines 284 and 286 of the package substrate 204 is considered coarse alignment. Referring to FIGS. 6, 17, and 18, for fine alignment, the table camera 211 is used to for generating a field of view 390 of solder bumps 106A, 106B, 106C, 106D, 106E, 106F, 106G, 106H, and 106I on the bottom surface 203 of the IC die 202 (step 389 of FIG. 17). The data processor 206 controls movement of the table camera 211 via the table camera servo 213 until predetermined solder bumps 106A and 106G near edges 392 and 394 of the IC die 202 are within the imaged field of view 390.

The data processor 206 analyzes the imaged field of view 390 from the table camera 211 to determine a first distance 396 between the first edge 392 of the IC die 202 and a center of the first solder bump 106G. In addition, the data processor 206 also determines a second distance 398 between the second edge 394 of the IC die 202 and a center of the second solder bump 106A. The data storage device 208 has stored therein desired values for the distances 396 and 398.

The data processor 206 subtracts the desired values for the distances 396 and 398 to those measured from the imaged field of view 390 to determine distance offsets. Such distance offsets may result for example from variance during formation of the solder bumps 106A-106I on the IC die 202. The data processor 206 uses such distance offsets to control movement of the robotic arm 214 carrying the IC die 202 via the robotic arm servo 216 for fine adjustment of the alignment of the IC die 202 with respect to the package substrate 204 (step 389 of FIG. 17). In this manner, the second robotic vision tool comprised of the data processor 206, the table camera 211, and the table camera servo 213 is used for fine alignment of the IC die 202 with respect to the package substrate 204.

Figure 19:
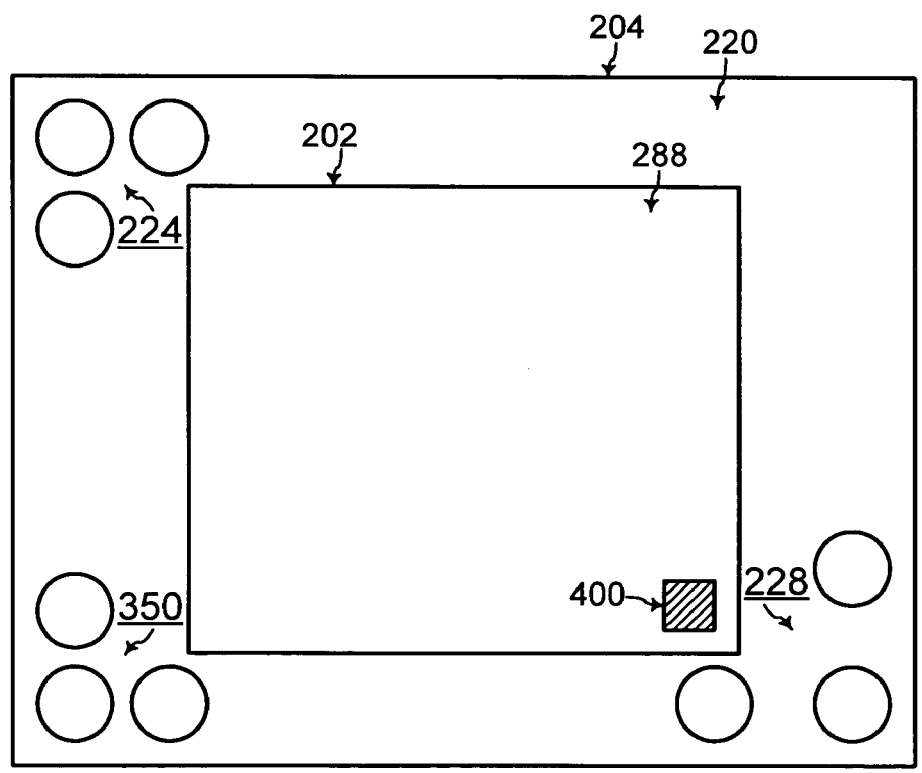
FIG. 19 illustrates use of the fiducials for checking for proper orientation of the IC die with respect to the package substrate, according to an embodiment of the present invention.

In another embodiment of the present invention, referring to FIGS. 17 and 19, the fiducials 224, 228, and 350 are used for checking for proper orientation of the IC die 202 with respect to the die package 204. Referring to FIG. 15, the second fiducial 228 is distinguishable from the first and third fiducials 224 and 350 because the distance 248 of the side dots 244 and 246 from the corner dot 242 is greater than such a distance 238 for the first and third fiducials 224 and 350.

The IC die 202 includes an orientation marking 400 thereon that is nearest to the second fiducial 228 of the three fiducials 224, 228, and 350 when the IC die 202 is placed onto the package substrate 204 with proper orientation. Because the second fiducial 228 is distinguishable from the first and third fiducials 224 and 350, the second fiducial 228 on the package substrate 204 and the orientation marking 400 on the IC die 202 are used to check for proper orientation of the IC die 202 with respect to the package substrate 204 (step 402 of FIG. 17).

The arm camera 210 may be used to image a field of view near the second fiducial 228. If the orientation marker 400 of the IC die 202 is near the second fiducial 228, then the IC die 202 has proper orientation with respect to the package substrate 204. If the orientation marker 400 of the IC die 202 is not near the second fiducial 228, then the IC die 202 is not properly orientated with respect to the package substrate 204.

If the data processor 206 determines that the IC die 202 is not properly oriented with respect to the package substrate 204 (step 402 of FIG. 17), the data processor 206 generates an alarm with the alarm generator 218 and ends operation (step 404 of FIG. 17). Thus, the operator is notified of such a faulty condition such that attachment of the IC die 202 onto the package substrate 204 with such wrong orientation is prevented. On the other hand, if the data processor determines that the IC die 202 is properly oriented with respect to the package substrate 204 (step 402 of FIG. 17), the operation of the system 200 of FIG. 6 for aligning the IC die 202 with respect to the package substrate 204 ends.

Figure 20:
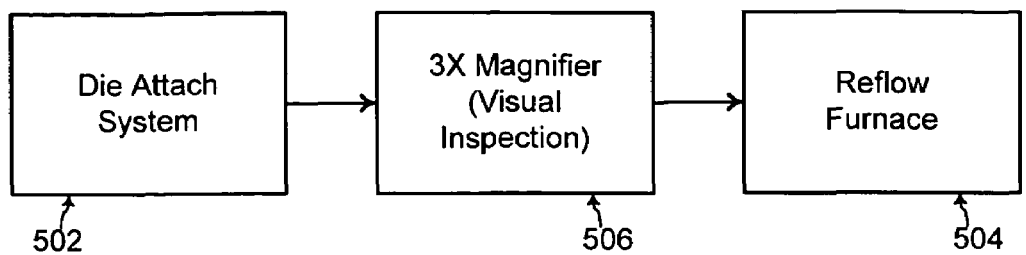
FIG. 20 illustrates a block diagram for attachment and reflow of the IC die to the package substrate with visual inspection for proper alignment.

Referring to FIG. 20, with proper orientation and alignment ensured from operation of the system 200 of FIG. 6, the IC die 202 is attached to the package substrate 204 within a die attach system 502. The system 200 of FIG. 6 may be part of the die attach system 502. A die attach mechanism for attaching the IC die 202 to the package substrate 204 is in general individually known to one of ordinary skill in the art. For example, a sticky material may be sprayed on the solder bumps of the IC die 202 that are placed onto the circular pads of the package substrate 204.

Alternatively, a clamping mechanism may be used to attach the IC die 202 to the package substrate 204.

After such attachment of the IC die 202 to the package substrate 204, inspection is performed for ensuring proper alignment of the IC die 202 with respect to the package substrate before a reflow process is performed within a reflow furnace 504. Referring to FIGS. 13 and 20, when the IC die 202 and the package substrate 204 that are attached together are placed into the reflow furnace 504, the solder bumps of the IC die 202 become molten to be electrically connected to the circular pads of the package substrate.

In FIG. 20, before such a reflow process within the reflow furnace 504, a magnifier 506 is used for visual inspection of the IC die 202 attached on the package substrate 204. Typically, the image through the magnifier 506 is magnified three times, and an operator visually inspects such a magnified image to ensure proper alignment of the IC die 202 with respect to the package substrate 204. However, such visual inspection by an operator is prone to human error and is time consuming.

Figure 21:
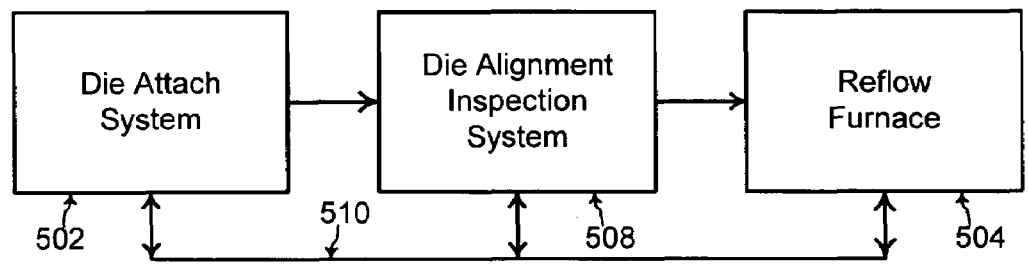
FIG. 21 illustrates a block diagram for attachment and reflow of the IC die to the package substrate with automated inspection for proper alignment, according to another aspect of the present invention.

Referring to FIG. 21, in another embodiment of the present invention, an automated die alignment inspection system 508 is used between the die attach system 502 and the reflow furnace 504. In addition, a systems link 510 is used for communication between the die attach system 502, the die alignment inspection system 508, and the reflow furnace 504.

Figure 22:
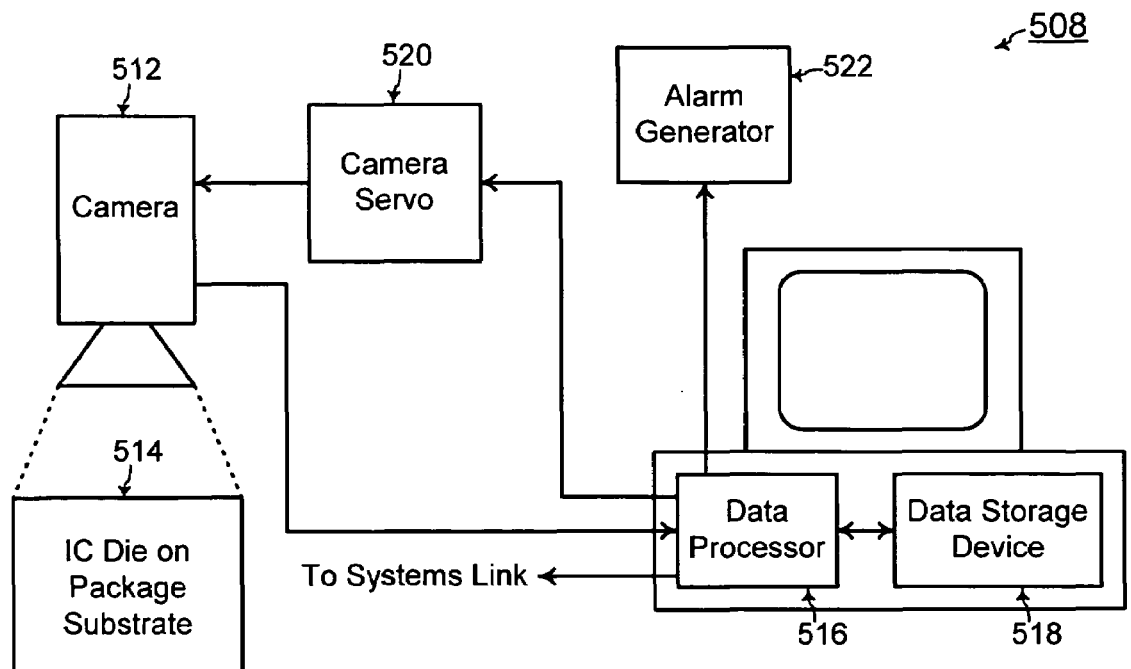
FIG. 22 illustrates a block diagram of components of the system for automated inspection for alignment between the IC die and the package substrate, according to an embodiment of the present invention.

FIG. 22 shows a block diagram of the die alignment inspection system 508 which includes a camera 512 for generating an image of an IC package 514 having the IC die 202 attached to the package substrate 204. In addition, the system 508 includes a data processor 516 and a data storage device 518. The data processor 516 is coupled to the data storage device 518 that stores data and instructions to be executed by the data processor 516 and that may also store temporary variables during execution of instructions by the data processor 516.

For example, the data processor 516 and the data storage device 518 may be components of a computer system that is in general individually known to one of ordinary skill in the art. The data storage device 518 may include a static storage device of the computer system such as a ROM (read only memory) device, a main memory of the computer system such as a RAM (random access memory) device, and/or any other type of data storage device such as a floppy disc or a compact disc, as generally known to one of ordinary skill in the art.

A camera servo 520 is coupled between the camera 512 and the data processor 516 for controlling movement of the camera 512. The data processor 516, the camera 512, and the camera servo 520 comprise a robotic vision tool. Additionally, an alarm generator 522 is coupled to the data processor 516. Furthermore, the data processor 516 is coupled to the systems link 510 for sending signals to the die attach system 502 or the reflow furnace 504. The components 512, 516, 518, 520, and 522 in the system 508 are in general individually known to one of ordinary skill in the art.

Figure 23:
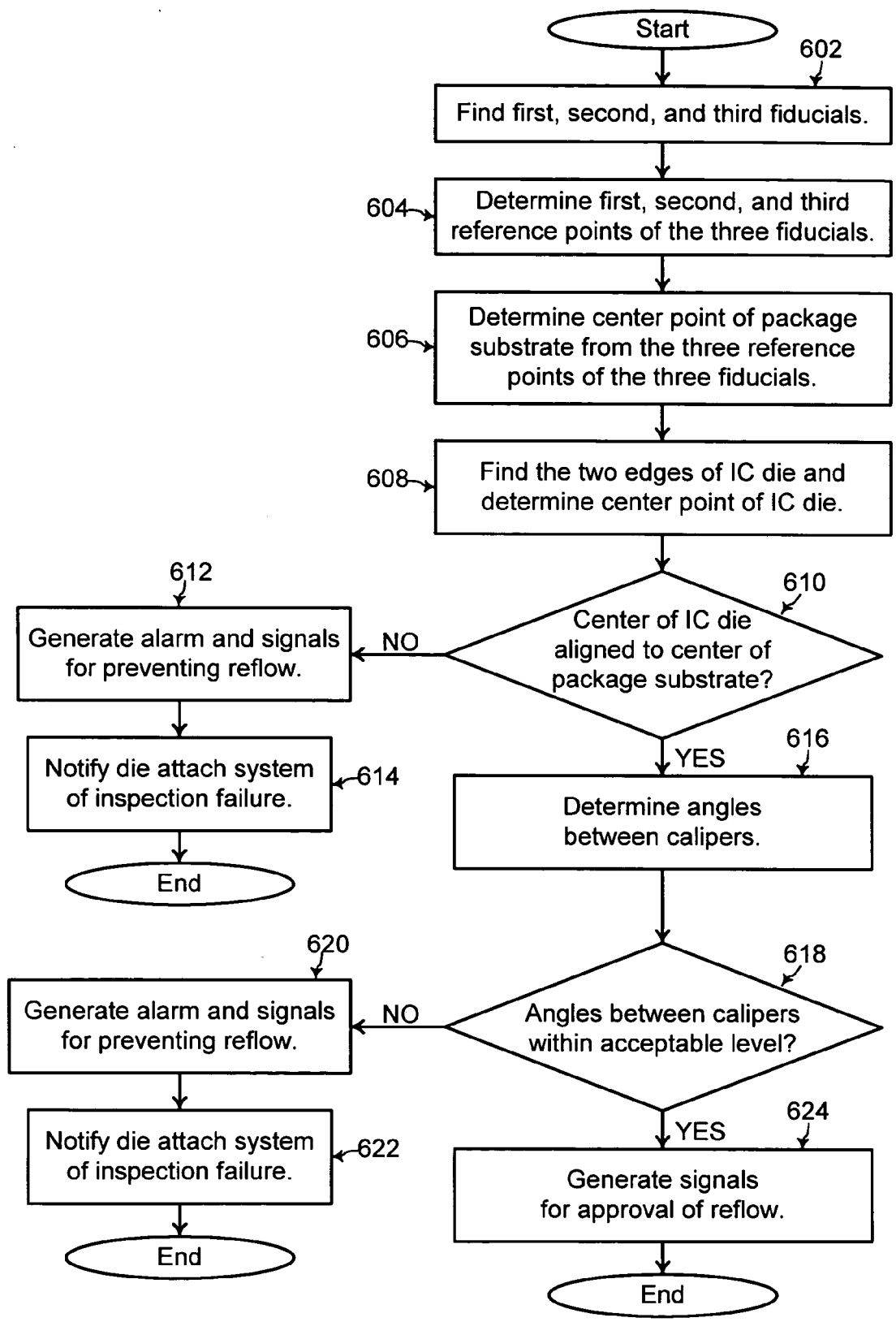
FIG. 23 illustrates a flow-chart of steps during operation of the system of 22, according to an embodiment of the present invention.
Figure 24:
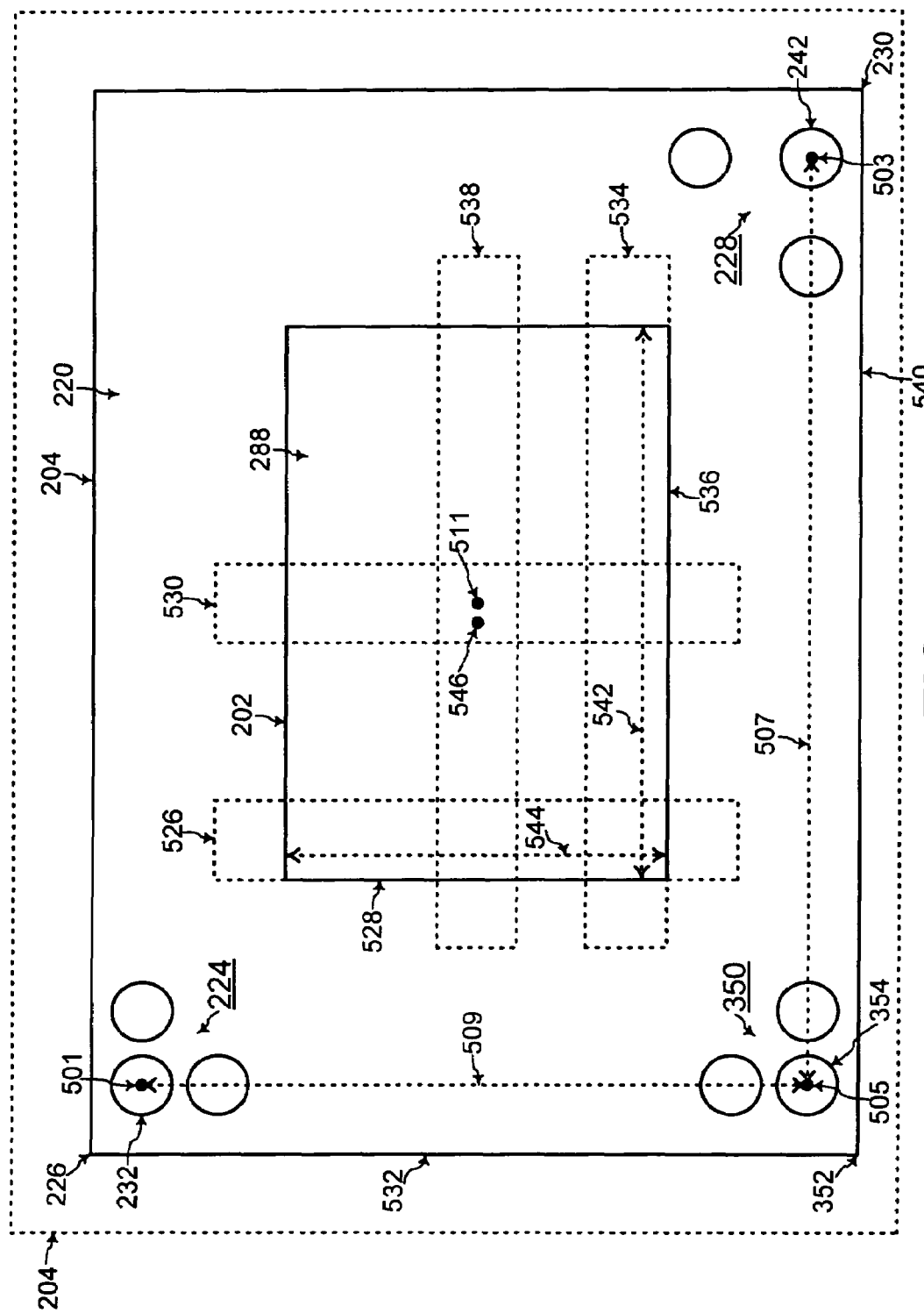
FIG. 24 illustrates an imaged field of view from a camera in the system of FIG. 22 with applications for determining the level of alignment between the IC die and the package substrate, according to an embodiment of the present invention.

FIG. 23 shows a flow-chart of steps performed by the data processor 516 of FIG. 22 from execution of instructions stored in the data storage device 518 for automated inspection of alignment between the IC die 202 and the package substrate 204, according to an embodiment of the present invention. Referring to FIGS. 23 and 24, the data processor 516 controls movement of the camera 512 via the camera servo 520 until an imaged field of view 524 from the camera 512 includes the IC die 202 attached to the package substrate 204.

Referring to FIGS. 14, 15, and 24, the package substrate 204 of FIG. 24 is similar to FIG. 15 including the first, second, and third fiducials 224, 228, and 350 disposed toward first, second, and third corners, 226, 230, and 352, respectively, of the package substrate 204, as already described herein with respect to FIG. 15. In addition, the IC die 202 has been attached to the package substrate 204 similarly as illustrated in FIG. 14 within the die attach system 502, as already described herein with respect to FIG. 8 or 17 for the system 200 of FIG. 6.

The data processor 516 finds the first, second, and third fiducials 224, 228, and 350 within the imaged field of view 524 from the camera 512 (step 602 of FIG. 23). Applications such as image recognition software for analyzing images from a camera by a data processor in general are individually known to one of ordinary skill in the art. In addition, the data processor 516 determines the first reference point 501 as the center point of the corner dot 232 for the first fiducial 224, the second reference point 503 as the center point of the corner dot 264 for the second fiducial 228, and the third reference point 505 as the center point of the corner dot 354 for the third fiducial 350 (step 604 of FIG. 23).

The data processor 516 determines an X-component 507 as the distance between the third reference point 505 and the second reference point 503, and a Y-component 509 as the distance between the third reference point 505 and the first reference point 501. The data processor 516 uses such X and Y components 507 and 509 to determine the center point 511 of the package substrate 204 similarly as described for the center point 282 in FIG. 12 (step 606 of FIG. 23).

Furthermore, the data processor 516 uses a first vertical caliper 526 with an edge that is aligned to a vertical edge 528 of the IC die 202 in the imaged field of view 524 from the camera 512. A second vertical caliper 530 is generated in the imaged field of view 524 to be parallel with a vertical edge 532 of the package substrate 204. Similarly, the data processor 516 uses a first horizontal caliper 534 with an edge that is aligned to a horizontal edge 536 of the IC die 202 in the imaged field of view 524. A second horizontal caliper 538 is generated in the imaged field of view 524 to be parallel with a horizontal edge 540 of the package substrate 204. Applications such as image processing software for analyzing and processing images from a camera by a data processor in general are individually known to one of ordinary skill in the art.

After the vertical edge 528 and the horizontal edge 536 of the IC die 202 are found using the vertical and horizontal calipers 526 and 534, the data processor determines an X-dimension 542 and a Y-dimension 544 of the IC die 202 (step 608 of FIG. 23). Furthermore, the data processor 516 uses the X-dimension 542 and the Y-dimension 544 to determine a center point 546 for the IC die 202 similarly as described for the center point 292 in FIG. 12 (step 608 of FIG. 23).

The data processor 516 determines whether the center point 511 of the package substrate 204 is aligned to the center point 546 of the IC die 202 (step 610 of FIG. 23). The data processor 516 determines that the center point 511 of the package substrate 204 is aligned to the center point 546 of the IC die 202 if the distance between the center points 511 and 546 is within an acceptable range such as less than 70 μm (micro-meters) for example. The acceptable range is determined from empirical experience of tolerance for various parameters such as die edge variation and variation of diameters of the solder bumps on the IC die 202 and the pads of the package substrate 204.

In another embodiment of the present invention, each of the X-component and the Y-component for the distance between the center points 511 and 546 must be within the acceptable range for the IC die 202 to be deemed acceptably aligned to the package substrate 204. Determination of the X and Y components of a distance between two points in general is individually known to one of ordinary skill in the art.

If the data processor 516 determines that the distance between the center points 511 and 546 is not within the acceptable range, the data processor 516 generates an alarm with the alarm generator 522 (step 612 of FIG. 23). Such an alarm indicates that the IC die 202 is not acceptably aligned to the package substrate 204. Thus, the operator is notified of such a faulty condition such that reflow of the solder bumps on the IC die 202 onto the circular pads of the package substrate 204 is prevented.

Upon generation of the alarm, the operator removes the IC die 202 from the package substrate 204 and may attempt to reattach the IC die 202 to the package substrate 204 with better alignment within the system 200 of FIG. 6. The die attach mechanism typically allows for removal of the IC die 202 from the package substrate 204. In contrast, reflow of the solder bumps of the IC die 202 onto the circular pads of the package substrate 204 is irreversible. Thus, inspection for proper alignment of the IC die 202 with respect to the package substrate 204 is performed before the reflow process within the reflow furnace 504.

Furthermore, the data processor 516 also communicates with the die attach system 502 via the systems link 510 to notify the die attach system 502 of the unacceptable level of alignment between the IC die 202 and the package substrate 204 (step 614 of FIG. 23). The die attach system 502 may automatically stop attaching the IC die 202 to the package substrate upon notification of such a faulty condition. Such communication is especially advantageous when the die attach system 502 and the die alignment inspection system 508 are disposed at remote locations.

Figure 25:
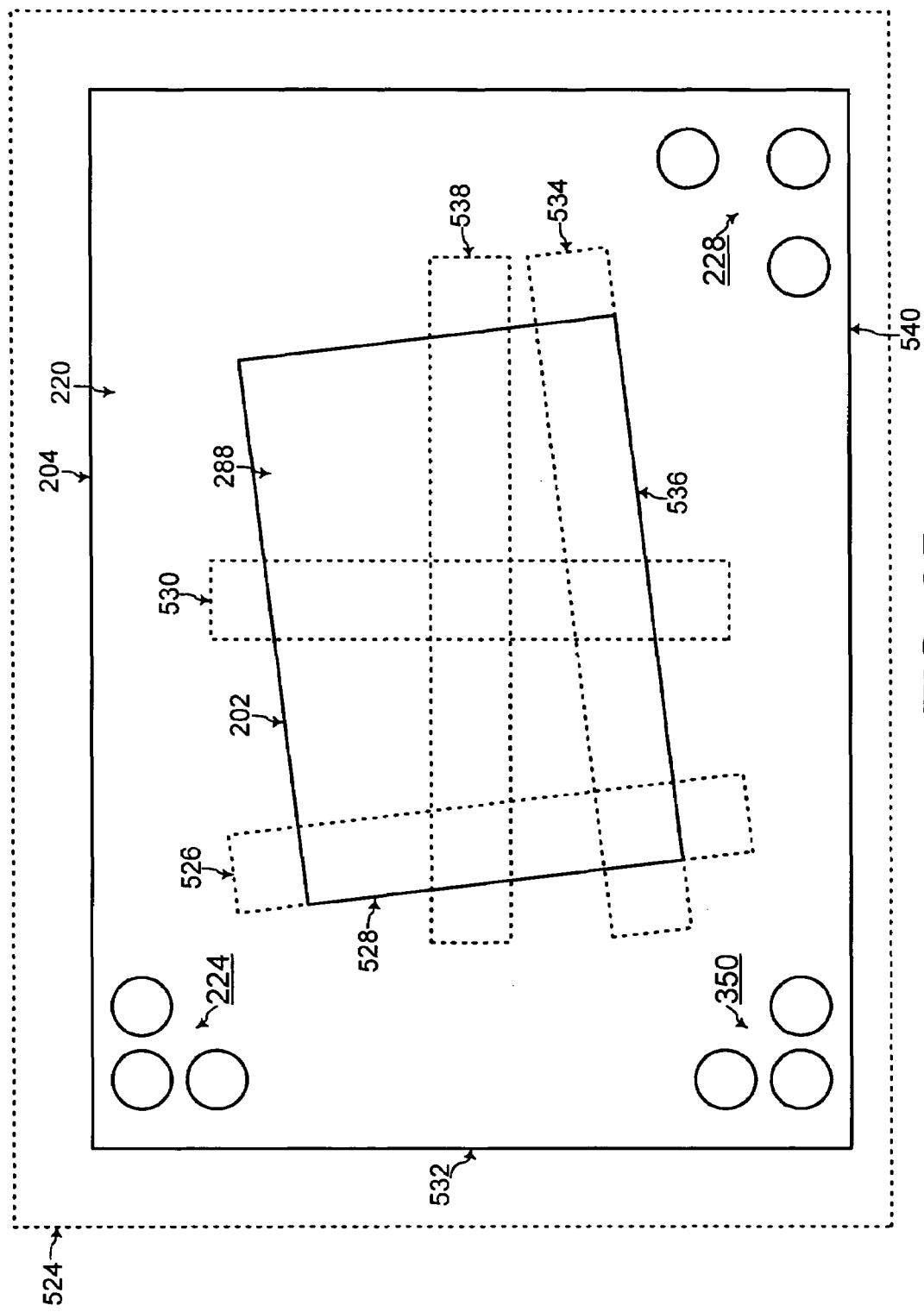
FIG. 25 illustrates the field of view of FIG. 24 with rotational misaligmnent between the IC die and the package substrate.

Furthermore, the data processor 516 also checks for rotational alignment between the IC die 202 and the package substrate 204. FIG. 25 illustrates the IC die 202 rotationally misaligned with respect to the package substrate in an exaggerated manner for clarity of illustration. For checking for such rotational alignment, the angles between the vertical calipers 526 and 530 and between the horizontal calipers 534 and 538 are determined (step 616 of FIG. 23).

The first vertical caliper 526 is aligned along the vertical edge 528 of the IC die 202, and the second vertical caliper 530 is aligned to be parallel to the vertical edge 532 of the package substrate 204. The data processor 516 determines a first caliper angle between the first and second vertical calipers 526 and 530. Similarly, the first horizontal caliper 534 is aligned along the horizontal edge 536 of the IC die 202, and the second horizontal caliper 538 is aligned to be parallel to the horizontal edge 540 of the package substrate 204. The data processor 516 determines a second caliper angle between the first and second horizontal calipers 534 and 538.

The data processor 516 determines whether each of the first and second caliper angles is within an acceptable rotational range such as less than 0.5° for example (step 618 in FIG. 23). The acceptable rotational range is determined from empirical experience of the relationship between the first and second caliper angles and acceptable alignment between the solder bumps of the IC die 202 and the pads of the package substrate 204.

If the data processor 516 determines that any of the first and second caliper angles is not within the acceptable rotational range, the data processor 516 generates an alarm with the alarm generator 522 (step 620 of FIG. 23). Such an alarm indicates that the IC die 202 is not rotationally aligned acceptably to the package substrate 204. Thus, the operator is notified of such a faulty condition such that reflow of the solder bumps of the IC die 202 onto the circular pads of the package substrate 204 is prevented.

Upon generation of the alarm, the operator removes the IC die 202 from the package substrate 204 and may attempt to reattach the IC die 202 to the package substrate 204 with better alignment within the system 200 of FIG. 6. Furthermore, the data processor 516 also communicates with the die attach system 502 via the systems link 510 to notify the die attach system 502 of the unacceptable level of rotational alignment between the IC die 202 and the package substrate 204 (step 622 of FIG. 23).

On the other hand, if the data processor 516 determines that the IC die 202 and the package substrate 204 are acceptably aligned rotationally and with the center points 546 and 511, the data processor 516 generates signals for approval of the reflow process through the reflow furnace 504 (step 624 of FIG. 23). Such approval from the data processor 516 indicates that the IC die 202 is properly aligned with respect to the package substrate 204. Thus, reflow of the solder bumps of the IC die 202 onto the circular pads of the package substrate 204 results in low resistance coupling between such solder bumps and circular pads.

In this manner, the data processor 516, the camera servo 520, and the camera 512 comprise a robotic vision tool that automatically inspects for alignment between the IC die 202 and the package substrate 204. Furthermore, the fiducials 224, 228, and 350 formed on the package substrate are used by the robotic vision tool for such automated inspection for alignment.

The foregoing is by way of example only and is not intended to be limiting. Any numbers specified herein are by way of example only. For example, the present invention may be practiced with any number of fiducials having any number of dots with any type of references at other locations aside from the example of the reference points 501, 503, and 505. In addition, the fiducials may be comprised of any other type of markings having different appearances from the three dots illustrated as embodiments of the present invention herein. Furthermore, any dimensions specified herein are by way of example only. Additionally, the present invention may also be practiced with different shapes and dimensions of the fiducial markings from the circular examples illustrated and described herein.

The present invention is limited only as defined in the following claims and equivalents thereof.

We claim:

1. A method for placing an IC (integrated circuit) die onto a package substrate, comprising:
    determining a first reference for a first fiducial on the package substrate;
    determining a second reference for a second fiducial on the package substrate; and
    placing the IC die onto the package substrate to be aligned with respect to the first and second references,
    wherein each of the first and second fiducials is comprised of a plurality of markings with each marking having a same size and shape as each pad on the package substrate.

2. The method of claim 1, wherein each of the first and second fiducials is comprised of a plurality of dots as the markings, and wherein each pad on the package substrate is aligned to a respective solder bump on the IC die.

3. The method of claim 1, wherein the first fiducial is disposed toward a first corner of the package substrate, and wherein the second fiducial is disposed toward a second corner of the package substrate.

4. The method of claim 3, wherein the first and second fiducials are disposed toward diagonally opposite corners of the package substrate.

5. The method of claim 4, further comprising:
determining a third reference for a third fiducial disposed toward a third corner of the package substrate; and
placing the IC die onto the package substrate to be aligned with respect to the first, second, and third references.

6. The method of claim 1, further comprising:
determining a third reference for a third fiducial on the package substrate; and
placing the IC die onto the package substrate to be aligned with respect to the first, second, and third references.

7. The method of claim 1, further comprising:
checking for proper orientation of the IC die with respect to at least one of the first and second fiducials.

8. The method of claim 1, further comprising:
determining a X component and a Y component for a distance between the first and second references; and
verifying that each of the X and Y components is within a respective acceptable range.

9. The method of claim 8, further comprising:
generating an alarm to prevent attachment of the IC die onto the package substrate when each of the X and Y components is not within the respective acceptable range.

10. The method of claim 1, wherein a robotic vision tool is used for locating the first and second fiducials, the method further comprising:
generating an alarm when the robotic vision tool does not locate the first or second fiducial within a predetermined time period.

11. A method for placing an IC (integrated circuit) die onto a package substrate, comprising:
determining a first reference for a first fiducial on the package substrate;
determining a second reference for a second fiducial on the package substrate; and
placing the IC die onto the package substrate to be aligned with respect to the first and second references,
wherein the first fiducial is comprised of a corner dot and two side dots, with each side dot being displaced from the corner dot with a first distance.

12. The method of claim 11, wherein a center of the corner dot is the first reference for the first fiducial.

13. The method of claim 11, wherein the second fiducial is comprised of a corner dot and two side dots, with each side dot being displaced from the corner dot with a second distance.

14. The method of claim 13, wherein a center of the corner dot for the second fiducial is the second reference.

15. The method of claim 13, wherein the first distance of the side dots from the corner dot for the first fiducial is different from the second distance of the side dots from the corner dot for the second fiducial.

16. The method of claim 15, further comprising:
checking for proper orientation of the IC die with respect to one of the first and second fiducials.

17. A method for placing an IC (integrated circuit) die onto a package substrate, comprising:
determining a first reference for a first fiducial on the package substrate;
determining a second reference for a second fiducial on the package substrate;
placing the IC die onto the package substrate to be aligned with respect to the first and second references;
determining a center point of the package substrate from the first and second references; and
aligning a center point of the IC die to the center point of the package substrate.

18. The method of claim 17, wherein the center point of the package substrate is aligned to the center point of the IC die for coarse alignment, and the method further comprising:
determining a distance of solder bumps on the IC die to edges of the IC die for fine alignment between the solder bumps and pads of the package substrate.

19. A system for placing an IC (integrated circuit) die onto a package substrate, comprising:
a first fiducial disposed at a first location of the package substrate;
a second fiducial disposed at a second location of the package substrate;
wherein each of the first and second fiducials is comprised of a plurality of markings with each marking having a same size and shape as each pad on the package substrate;
means for determining a first reference for the first fiducial and a second reference for the second fiducial; and
means for placing the IC die onto the package substrate to be aligned with respect to the first and second references.

20. The system of claim 19, wherein each of the first and second fiducials is comprised of a plurality of dots as the markings, and wherein each pad on the package substrate is aligned to a respective solder bump on the IC die.

21. The system of claim 19, wherein the first location is toward a first corner of the package substrate, and wherein the second location is toward a second corner of the package substrate.

22. The system of claim 21, wherein the first and second locations are disposed toward diagonally opposite corners of the package substrate.

23. The system of claim 21, further comprising:
a third fiducial disposed toward a third corner of the package substrate;
means for determining a third reference for the third fiducial; and
means for placing the IC die onto the package substrate to be aligned with respect to the first, second, and third references.

24. The system of claim 19, further comprising:
a third fiducial disposed at a third location of the package substrate;
means for determining a third reference for the third fiducial; and
means for placing the IC die onto the package substrate to be aligned with respect to the first, second, and third references.

25. The system of claim 19, further comprising:
means for checking for proper orientation of the IC die with respect to at least one of the first and second fiducials.

26. The system of claim 19, further comprising:
means for determining a X component and a Y component for a distance between the first and second references; and means for verifying that each of the X and Y components is within a respective acceptable range.

27. The system of claim 26, further comprising:
means for generating an alarm to prevent attachment of the IC die onto the package substrate when each of the X and Y components is not within the respective acceptable range.

28. The system of claim 19, wherein a robotic vision tool is used for locating the first and second fiducials, the system further comprising:
means for generating an alarm when the robotic vision tool does not locate the first or second fiducial within a predetermined time period.

29. A system for placing an IC (integrated circuit) die onto a package substrate, comprising:
a first fiducial disposed at a first location of the package substrate;
a second fiducial disposed at a second location of the package substrate;
means for determining a first reference for the first fiducial and a second reference for the second fiducial; and
means for placing the IC die onto the package substrate to be aligned with respect to the first and second references,
wherein the first fiducial is comprised of a corner dot and two side dots, with each side dot being displaced from the corner dot with a first distance.

30. The system of claim 29, wherein a center of the corner dot is the first reference for the first fiducial.

31. The system of claim 29, wherein the second fiducial is comprised of a corner dot and two side dots, with each side dot being displaced from the corner dot with a second distance.

32. The system of claim 31, wherein a center of the corner dot for the second fiducial is the second reference.

33. The system of claim 31, wherein the first distance of the side dots from the corner dot for the first fiducial is different from the second distance of the side dots from the corner dot for the second fiducial.

34. The system of claim 33, further comprising:
means for checking for proper orientation of the IC die with respect to one of the first and second fiducials.

35. A system for placing an IC (integrated circuit) die onto a package substrate, comprising:
a first fiducial disposed at a first location of the package substrate;
a second fiducial disposed at a second location of the package substrate;
means for determining a first reference for the first fiducial and a second reference for the second fiducial;
means for placing the IC die onto the package substrate to be aligned with respect to the first and second references;
means for determining a center point of the package substrate from the first and second references; and
means for aligning a center point of the IC die to the center point of the package substrate.

36. The system of claim 35, wherein the center point of the IC die is aligned to the center point of the package substrate for coarse alignment, the system further comprising:
means for determining distances of the solder bumps on the IC die to edges of the IC die for fine alignment of the solder bumps to pads of the package substrate.

* * * * *